(12) United States Patent
Tada et al.

(10) Patent No.: US 10,312,288 B2
(45) Date of Patent: Jun. 4, 2019

(54) SWITCHING ELEMENT, SEMICONDUCTOR DEVICE, AND SEMICONDUCTOR DEVICE MANUFACTURING METHOD

(71) Applicant: NEC Corporation, Minato-ku, Tokyo (JP)

(72) Inventors: Munehiro Tada, Tokyo (JP); Tadahiko Sugibayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/561,586

(22) PCT Filed: Apr. 6, 2016

(86) PCT No.: PCT/JP2016/001926
§ 371 (c)(1),
(2) Date: Sep. 26, 2017

(87) PCT Pub. No.: WO2016/163120
PCT Pub. Date: Oct. 13, 2016

(65) Prior Publication Data
US 2018/0061890 A1  Mar. 1, 2018

(30) Foreign Application Priority Data
Apr. 6, 2015  (JP) .................................. 2015-077495

(51) Int. Cl.
*H01L 47/00* (2006.01)
*H01L 27/24* (2006.01)
(Continued)

(52) U.S. Cl.
CPC ........ *H01L 27/2445* (2013.01); *H01L 27/105* (2013.01); *H01L 45/085* (2013.01);
(Continued)

(58) Field of Classification Search
CPC . H01L 27/2445; H01L 27/105; H01L 45/085; H01L 45/1233; H01L 45/1266; H01L 45/145; H01L 45/146; H01L 45/16; H01L 45/1683
See application file for complete search history.

(56) References Cited

U.S. PATENT DOCUMENTS

2004/0114428 A1  6/2004  Morikawa
2012/0075910 A1  3/2012  Yasuda
(Continued)

FOREIGN PATENT DOCUMENTS

JP  2004-186553 A  7/2004
JP  2010-153591 A  7/2010
(Continued)

OTHER PUBLICATIONS

M. Tada, et al., "Polymer Solid-Electrolyte Switch Embedded on CMOS for Nonvolatile Crossbar Switch", IEEE Transaction on Electron Devices, vol. 58, No. 12, pp .4398-4405, Dec. 2011 (9 pages total).
(Continued)

*Primary Examiner* — Victor A Mandala
*Assistant Examiner* — Colleen E Snow

(57) ABSTRACT

In the cases of performing programming by forming a two-terminal-type variable resistance element on a semiconductor device, it has been difficult to control the programming, and malfunctions have often occurred. This switching element includes at least a first variable resistance element, a second variable resistance element, a first rectifying element, and a second rectifying element, one end of the first variable resistance element and one end of the second variable resistance element are respectively connected to one end of the first rectifying element and one end of the second rectifying element, and each of the rectifying elements has two terminals.

10 Claims, 15 Drawing Sheets

(51) Int. Cl.
*H01L 27/105* (2006.01)
*H01L 45/00* (2006.01)
*G11C 13/00* (2006.01)

(52) U.S. Cl.
CPC ...... *H01L 45/1233* (2013.01); *H01L 45/1266* (2013.01); *H01L 45/145* (2013.01); *H01L 45/146* (2013.01); *H01L 45/16* (2013.01); *H01L 45/1683* (2013.01); *G11C 13/0035* (2013.01)

(56) References Cited

U.S. PATENT DOCUMENTS

2013/0181180 A1  7/2013  Tada et al.
2015/0340606 A1  11/2015  Tada et al.

FOREIGN PATENT DOCUMENTS

| JP | 2011-172084 A | 9/2011 |
| JP | 2012-74118 A | 4/2012 |
| WO | 2012/043502 A1 | 4/2012 |
| WO | 2014/112365 A1 | 7/2014 |

OTHER PUBLICATIONS

International Search Report dated Jun. 14, 2016 issued by the International Searching Authority in International application No. PCT/JP2016/001926.
Translation of Written Opinion (original document previously submitted on Sep. 26, 2017).

SWITCHING ELEMENT, SEMICONDUCTOR DEVICE, AND SEMICONDUCTOR DEVICE MANUFACTURING METHOD

This application is a National Stage Entry of PCT/JP2016/001926 filed on Apr. 6, 2016, which claims priority from Japanese Patent Application 2015-077495 filed on Apr. 6, 2015, the contents of all of which are incorporated herein by reference, in their entirety.

TECHNICAL FIELD

The present invention relates to a semiconductor device and a semiconductor device manufacturing method, and relates particularly to a switching element including a nonvolatile-type variable-resistance element (hereinafter referred to as a variable-resistance element) and a rectifying element inside a multilayer wiring layer, a semiconductor device, and a semiconductor device manufacturing method.

BACKGROUND ART

Integration and power saving of semiconductor devices (in particular, silicon devices) have been promoted by miniaturization (scaling law: Moore's law) of devices at a pace of quadrupling in three years in terms of development. A gate length of a metal oxide semiconductor field effect transistor (MOSFET) has become 20 nm or less in recent years, and substantial rise in a lithography process cost (a device price and a mask set price) and a physical limit (an operating limit and a variation limit) of a device size have necessitated improved device performance by an approach different from the conventional scaling law.

A rewritable programmable logic device called a field programmable gate array (FPGA) positioned between a gate array and a standard cell has been developed in recent years. The FPGA allows a customer himself/herself to perform any circuit configuration after the chip is manufactured. The FPGA includes a variable-resistance element inside a multilayer wiring layer and allows a customer himself/herself to form an arbitrary electrical connection in wiring. Use of a semiconductor device equipped with such an FPGA enables improvement of flexibility in circuit design.

Memories using a variable-resistance element include a magneto-resistive random access memory (MRAM), a phase change RAM (PRAM), a resistance random access memory (ReRAM), and a conductive bridging random access memory (CBRAM: RAM that uses conductive path formed by ions of solid electrolyte).

The ReRAM uses a characteristic that a resistance value varies by externally applied voltage and current, either in an ON-state in which a conductive path is formed inside a variable-resistance film forming a variable-resistance element, or, conversely, in an OFF-state in which the conductive path formed inside the variable-resistance film is eliminated. Accordingly, the ReRAM cell uses a structure including a variable-resistance film composed of a metallic oxide, sandwiched between two electrodes. For example, an ON-state is generated by applying an electric field to the variable-resistance film in such a way as to form a filament inside the variable-resistance film or to form a conductive path between the two electrodes. Then, on the other hand, an OFF-state is generated by applying an electric field in an inverse direction to the variable-resistance film in such a way as to eliminate the filament or to eliminate the conductive path formed between the two electrodes. By reversing the direction of the electric field applied to the variable-resistance film, switching between the ON-state and the OFF-state, is performed, the states having greatly different resistance values between the two electrodes. Data are stored by using current flowing through the variable-resistance element, being different depending on a difference in the resistance value between the aforementioned ON-state and OFF-state. When data are written, depending on data to be stored, a voltage value, a current value, and a pulse width that cause transition from the OFF-state to the ON-state or transition from the ON-state to the OFF-state is selected, and generation or elimination of the filament for data storage, or formation or elimination of the conductive path is performed.

Non-Patent Literature 1 (NPL1) discloses a variable-resistance element that is highly likely to improve flexibility of a "circuit" used in a "memory cell" configuration in an ReRAM, as a type of a variable-resistance element used in an ReRAM configuration. The variable-resistance element is a nonvolatile switching element that reversibly changes a resistance value between electrodes sandwiching the variable-resistance film, by using metal ion movement in an ion conductor, and "precipitation of metal by reduction of a metal ion" and "generation of a metal ion by oxidation of metal" by an electrochemical reaction, and performs switching. The nonvolatile switching element disclosed in NPL1 is composed of a "solid electrolyte" composed of an ion conductor, and a "first electrode" and a "second electrode" provided in contact with two surfaces of the "solid electrolyte," respectively. A "first metal" constituting the "first electrode" and a "second metal" constituting the "second electrode," constituting the nonvolatile switching element, have different values of standard Gibbs energy of formation ΔG in a process of oxidizing a metal and generating a metal ion.

In the nonvolatile switching element disclosed in NPL1, the "first metal" constituting the "first electrode" and the "second metal" constituting the "second electrode" are respectively selected as follows.

When "bias voltage" causing transition from an OFF-state to an ON-state is applied between the "first electrode" and the "second electrode," a metal capable of supplying a metal ion to a "solid electrolyte," by the metal being oxidized by an electrochemical reaction induced by the applied "bias voltage" and the metal ion being generated, is employed as the "first metal" constituting the "first electrode" at an interface between the "first electrode" and the "solid electrolyte."

When "bias voltage" causing transition from an ON-state to an OFF-state is applied between the "first electrode" and the "second electrode" and the "first metal" is precipitated on a surface of the "second electrode," while, with regard to the "first metal" precipitated on the surface of the "second electrode," the metal is oxidized by an electrochemical reaction induced by the applied "bias voltage," generates a metal ion, and dissolves into the "solid electrolyte" as the metal ion, with regard to the "second metal" constituting the "second electrode," a metal that, depending on the applied "bias voltage," may not induce a process of the metal being oxidized and a metal ion being generated, is employed.

A switching operation in a metal bridge type variable-resistance element achieving an ON-state and an OFF-state by "formation of a metal bridge structure" and "dissolution of a metal bridge structure" will be briefly described.

In a transition process (setting process) from an OFF-state to an ON-state, when the second electrode is grounded and the first electrode is applied with positive voltage, a metal in the first electrode turns to a metal ion and dissolves into a solid electrolyte at an interface between the first electrode and the solid electrolyte. On the other hand, on the second electrode side, by using an electron supplied by the second electrode, a metal ion in the solid electrolyte turns to a metal in the solid electrolyte and is precipitated. A metal bridge structure is formed by metals precipitated in the solid electrolyte and a metal bridge connecting the first electrode and the second electrode is finally formed. A switch goes into an ON-state by electrically connecting the first electrode and the second electrode by the metal bridge.

On the other hand, in a transition process (resetting process) from an ON-state to an OFF-state, when the second electrode is grounded and the first electrode is applied with negative voltage with respect to an ON-state switch, a metal constituting a metal bridge turns to a metal ion and dissolves into the solid electrolyte. As the dissolution progresses, part of a "metal bridge structure" constituting the metal bridge breaks. When the metal bridge connecting the first electrode and the second electrode finally breaks, the electrical connection breaks, and the switch goes into an OFF-state.

Note that, as the dissolution of metals progresses, electrical characteristics change in a stage before the electrical connection completely breaks in such a way that resistance between the first electrode and the second electrode increases due to narrowing of the "metal bridge structure" constituting a conduction path, and also, inter-electrode capacity changes due to dissolved metal ions being reduced and precipitated as metals at the interface between the first electrode and the solid electrolyte, leading to decreased concentration of metal ions contained in the "solid electrolyte" and change in a relative dielectric constant, and then the electrical connection finally breaks.

Further, when the second electrode in the metal bridge type variable-resistance element caused to transition (reset) to an OFF-state is grounded and the first electrode is applied with positive voltage again, a transition process (setting process) from the OFF-state to an ON-state progresses. In other words, in the metal bridge type variable-resistance element, a transition process (setting process) from an OFF-state to an ON-state and a transition process (resetting process) from an ON-state to an OFF-state can be performed reversibly.

Further, NPL1 discloses a configuration and a switching operation of a two-terminal-type switching element including two electrodes arranged through an ion conductor and controlling a conduction state between the two electrodes.
(Definition of Polarity of Variable-resistance Element)

Regardless of the aforementioned operating principle, an operating characteristic of a variable-resistance element applicable to the present invention can be classified into a unipolar type performing a variable-resistance operation, based on an applied voltage level, and a bipolar type performing a variable-resistance operation, based on an applied voltage level and a voltage polarity. It is preferable to use a bipolar-type variable-resistance element in the present invention.
<Description of Solid-electrolyte-layer-type Variable-resistance Element>

As an example of the aforementioned bipolar-type variable-resistance element, NPL1 discloses a switching element using metal ion movement and an electrochemical reaction in a solid electrolyte layer (a solid in which an ion is able to move freely by application of an electric field and the like). The switching element disclosed in NPL1 is composed of three layers of a solid electrolyte layer, and a first electrode and a second electrode that are arranged to face one another abutting the solid electrolyte layer at one side and another side opposite to the one side, respectively. The first electrode plays a role of supplying a metal ion to the solid electrolyte layer. The second electrode does not supply a metal ion.

An operation of the switching element will be briefly described below.

When the first electrode is grounded and the second electrode is applied with negative voltage, a metal in the first electrode turns to a metal ion and dissolves into the solid electrolyte layer. Then, the metal ion in the solid electrolyte layer turns to a metal and is precipitated in the solid electrolyte layer. By metals precipitated in the solid electrolyte layer, a metal bridge connecting the first electrode and the second electrode is formed. By the first electrode and the second electrode electrically connected by the metal bridge, the switching element goes into an ON-state.

On the other hand, when the first electrode is grounded and the second electrode is applied with positive voltage in the aforementioned ON-state, part of the metal bridge breaks. Consequently, the electrical connection between the first electrode and the second electrode breaks, and the switching element goes into an OFF-state. Note that, the electrical characteristics of the electrical connection change in a stage before the electrical connection completely breaks, in such a way that resistance between the first electrode and the second electrode increases, capacity between the first electrode and the second electrode changes, and the like, and then the electrical connection finally breaks.

Further, in order to change from the aforementioned OFF-state to an ON-state, the first electrode may be grounded and the second electrode may be applied with negative voltage, again.

As a switching element by a solid-electrolyte-layer-type variable-resistance element, NPL1 discloses a configuration and an operation of a two-terminal-type switching element including first and second electrodes arranged through a solid electrolyte layer and controlling a conduction state therebetween.

A switching element by such a solid-electrolyte-layer-type variable-resistance element features a smaller size and less ON-resistance compared with a semiconductor switch such as a MOSFET. Accordingly, the switching element is considered promising for application to a programmable logic device.

Further, in the switching element, a conduction state (ON or OFF) thereof is maintained intact even when applied voltage is turned off. Accordingly, application to a nonvolatile memory element may also be considered. For example, with a memory cell including one selection element, such as a transistor, and one switching element, as a basic unit, a plurality of the memory cells are arranged in a longitudinal direction and a transverse direction, respectively. Such an arrangement enables selection of any memory cell with a word line and a bit line, out of the plurality of memory cells. Then, a nonvolatile memory capable of sensing a conduction state of the switching element in the selected memory cell and reading which information of information "1" or "0" is stored, from an ON-state or OFF-state of the switching element, can be provided.

With regard to a nonvolatile variable-resistance element, Patent Literature 1 (PTL1) discloses a configuration provided with a first electrode, a second electrode, a variable resistor connected to both of the first electrode and the second electrode, and a control electrode (third electrode) connected to the variable resistor through a dielectric layer, the dielectric layer being in contact with a side surface of a second variable resistor.

Patent Literature 2 (PTL2) relates to a memory circuit holding wiring connection information and logic information, and proposes connecting a first variable-resistance element, a second variable-resistance element, and a first switching element in series between a first power source and a second power source.

CITATION LIST

Patent Literature

[PTL1] Japanese Patent Application Laid-open No. 2010-153591
[PTL2] Japanese Patent Application Laid-open No. 2011-172084

Non Patent Literature

[NPL1] M. Tada, K. Okamoto, T. Sakamoto, M. Miyamura, N. Banno, and H. Hada, "Polymer Solid-Electrolyte (PSE) Switch Embedded on CMOS for Nonvolatile Crossbar Switch," IEEE TRANSACTION ON ELECTRON DEVICES, Vol. 58, No. 12, pp. 4398 to 4405, (2011)

SUMMARY OF INVENTION

Technical Problem

An analysis of the aforementioned related arts is given below.

When a two-terminal-type variable-resistance element as described above is formed on a semiconductor device and programmed, particularly when the element is applied to a switch that switches transmission destinations of a signal line in a nonvolatile manner, one selection transistor (access transistor) is required for each variable-resistance element for programming the variable-resistance element, and this poses an issue that the area of such transistor effectively makes an area of the switching element larger.

The present invention is novel and made in attempt to resolve the aforementioned issue, and a main object thereof is to provide a switching element, a semiconductor device, and a semiconductor device manufacturing method that may prevent an erroneous write and a malfunction, and enable increased reliability and density.

Solution to Problem

A switching element according to an aspect of the present invention comprises: at least a first variable-resistance element, a second variable-resistance element, a first rectifying element, and a second rectifying element, wherein each of the first rectifying element and the second rectifying element is a two-terminal element, and one end portion of the first variable-resistance element and one end portion of the second variable-resistance element are respectively connected to one end portion of the first rectifying element and one end portion of the second rectifying element.

According to another aspect of the present invention, there is provided a semiconductor device including a bipolar-type variable-resistance element in a copper multilayer wiring layer on a semiconductor substrate, the semiconductor device comprises: a plurality of copper wiring lines formed in the copper multilayer wiring layer, the plurality of copper wiring lines further serving as the first electrodes; an insulating barrier film formed on the plurality of copper wiring lines also serving as first electrodes; an opening formed on the insulating barrier film, the opening exposing the copper wiring lines serving as the first electrode; a variable-resistance film formed on a plane including the opening; a second electrode formed on the variable-resistance film; a rectifying element formed on the second electrode; and a third electrode formed on the rectifying element.

According to still another aspect of the present invention, there is provided a manufacturing method of a semiconductor device including a bipolar-type variable-resistance element in a copper multilayer wiring layer on a semiconductor substrate, the manufacturing method comprises: a step of forming an insulating barrier film on a copper wiring lines further serving as a first electrode; a step of forming an opening on the insulating barrier film, the opening exposing the copper wiring line serving as a first electrode; a step of forming a variable-resistance film on a surface including the opening; a step of forming a second electrode on the variable-resistance film; and a step of forming a rectifying element above the second electrode.

Advantageous Effect of Invention

The present invention prevents an erroneous write and a malfunction of a variable-resistance element and enables increased density.

DESCRIPTION OF EMBODIMENTS

[First Example Embodiment]
<First Aspect: Switching Element Comprising Two Variable-Resistance Elements and Two Rectifying Elements>

Figure 2:
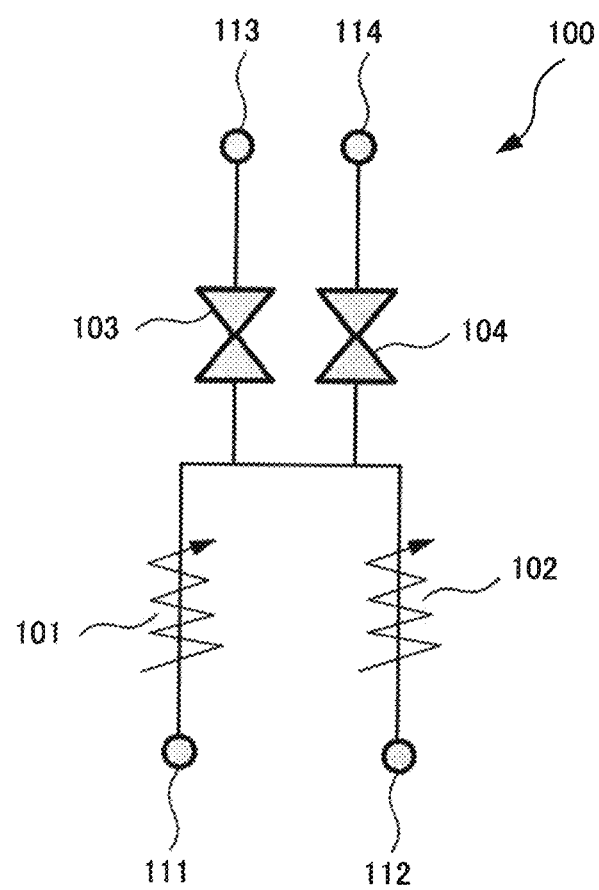
FIG. 2 is a circuit diagram illustrating a configuration example of the switching element according to the first example embodiment of the present invention.

Referring to FIG. 2, a switching element 100 according to a first aspect of the present invention includes a first variable-resistance element 101, a second variable-resistance element 102, a first rectifying element 103 one end of which is connected to one end side of the first variable-resistance element 101, and a second rectifying element 104 one end of which is connected to one end side of the second variable-resistance element 102. A connecting point of the first variable-resistance element 101 and the first rectifying element 103 is connected to a connecting point of the second variable-resistance element 102 and the second rectifying element 104. The other end side of the first variable-resistance element 101 is connected to a first terminal 111, and the other end side of the second variable-resistance element 102 is connected to a second terminal 112. The other end side of the first rectifying element 103 is connected to a third terminal (control terminal) 113, and the other end side of the second rectifying element 104 is connected to a fourth terminal (control terminal) 114.

The switching element 100 is able to change a resistance state of the first variable-resistance element 101 by applying voltage between the first terminal 111 and the third terminal 113. Further, the switching element 100 is able to change a resistance state of the second variable-resistance element 102 by applying voltage between the second terminal 112 and the fourth terminal 114.

When a voltage less than or equal to a programming voltage is applied to the third terminal 113 or the fourth terminal 114, the third terminal 113 and the fourth terminal 114 are insulated and separated from the first variable-resistance element 101 and the second variable-resistance element 102 by the first rectifying element 103 or the second rectifying element 104. Consequently, the third terminal 113 and the fourth terminal 114 are separated from a logic signal/read signal propagating between the first terminal 111 and the second terminal 112. Thus, signal transmission is performed with the aforementioned two variable-resistance elements therebetween, and programming of the variable-resistance element is performed with the rectifying element therebetween. While the first terminal 111 may be referred to as an input terminal, and the second terminal 112 may be referred to as an output terminal, in a description below, the reason will become obvious as the description progresses.

By changing a resistance state of a variable-resistance element by applying voltage through the first rectifying element 103 or the second rectifying element 104, such an example embodiment is able to make a control signal line for programming independent of a signal line (or a read line) to be connected after the programming. Consequently, an erroneous write and a malfunction in the variable-resistance element can be prevented.

Figure 1:
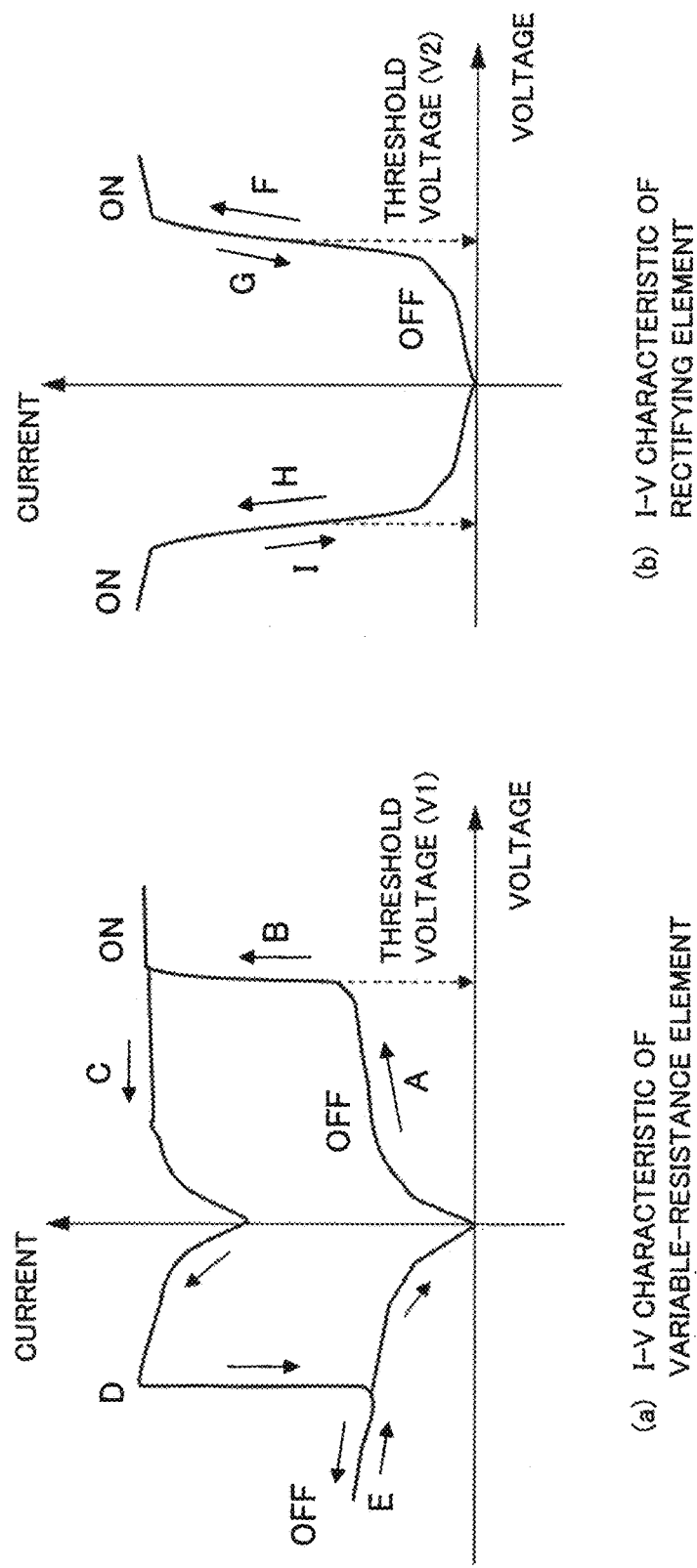
FIG. 1 is a diagram illustrating an example of a current-voltage characteristic of a bipolar-type variable-resistance element (FIG. 1(a)) and an example of a current-voltage characteristic of a bipolar-type rectifying element (FIG. 1(b)), in a switching element according to a first example embodiment of the present invention.

Operating characteristics of the variable-resistance element and the rectifying element at this time will be described, taking a bipolar type as an example. FIG. 1(a) illustrates an example of a current I-voltage V characteristic of a bipolar-type variable-resistance element, and FIG. 1(b) illustrates an example of a current I-voltage V characteristic of a bipolar-type rectifying element.

In a case that positive voltage is applied to a first electrode in the variable-resistance element, leak current gradually increases (arrow A in FIG. 1(a)), and, as the voltage exceeds a threshold voltage V1, a resistance state transitions from a high-resistance state (OFF-state) to a low-resistance state (ON-state) (arrow B in FIG. 1(a)). Even in a case that the voltage is returned to 0 V, the variable-resistance element maintains the low-resistance state (arrow C in FIG. 1(a)). Next, in a case that negative voltage is applied to the first electrode in the variable-resistance element, as the current reaches a predetermined peak current, the resistance state transitions from the low-resistance state (ON-state) to a high-resistance state (OFF-state) (D in FIG. 1(a)). Since the variable-resistance element is a bipolar-type variable-resistance element, even in a case that negative voltage is further applied to the first electrode, the resistance state does not change (E in FIG. 1(a)).

In a case that positive voltage is applied to a first electrode in the rectifying element, leak current gradually increases, and, as the voltage exceeds a threshold voltage V2, a resistance state transitions from a high-resistance state (OFF-state) to a low-resistance state (ON-state) (arrow F in FIG. 1(b)). Since the resistance state of the rectifying element is volatile, in a case that the voltage is returned to 0 V, as the voltage reaches a voltage less than the threshold voltage V2, the current value decreases (arrow G in FIG. 1(b)). On the other hand, in a case that voltage is applied in an inverse direction in the rectifying element, the leak current gradually increases as negative voltage increases, similarly to the case that positive voltage is applied, and, as the voltage exceeds a threshold voltage −V2, the resistance state transitions from a high-resistance state (OFF-state) to a low-resistance state (ON-state) (arrow H in FIG. 1(b)). Since the resistance state of the rectifying element is volatile, in a case that the negative voltage is returned to 0 V, as the voltage reaches a voltage less than the threshold voltage −V2, the current value decreases (arrow I in FIG. 1(b)).

At this time, the voltage applied between the first terminal 111 and the third terminal 113 is voltage divided between the first variable-resistance element 101 and the rectifying element 103. For example, in order to change (program) a resistance state of the variable-resistance element from an OFF-state to an ON-state with a lower control voltage, it is preferable that most of the applied control voltage be applied to the variable-resistance element. Accordingly, it is preferable that a leak current level in an OFF-state in the rectifying element be lower than that in the variable-resistance element.

Accordingly, it is preferable that a relation between the threshold voltage V2 in the rectifying element 103, and the threshold voltage V1 in the first variable-resistance element 101 and the second variable-resistance element 102 be V2<V1.

It is preferable that operating polarities of the aforementioned first variable-resistance element, second variable-resistance element, and rectifying element be same. In other words, it is preferable to use a bipolar-type rectifying element (bidirectional rectifying element) when a bipolar-type variable-resistance element is used, and it is preferable to use a unipolar-type rectifying element (unidirectional rectifying element) when a unipolar-type variable-resistance element is used. The reason is that, in the case of the bipolar-type variable-resistance element, switching is performed by intensity and a flowing direction of current, and a characteristic of the same polarity is consequently required to the rectifying element.

Figure 3:
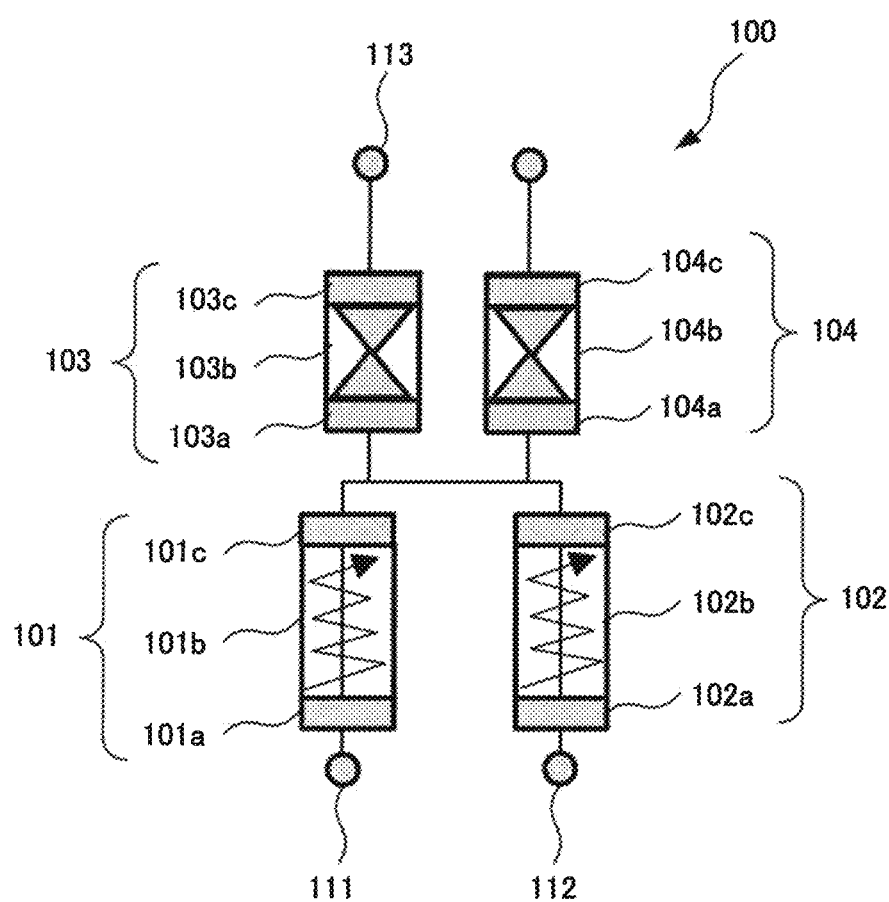
FIG. 3 is a diagram for illustrating an electrode configuration of the switching element illustrated in FIG. 2.

FIG. 3 is a diagram for illustrating an electrode configuration of the switching element 100 illustrated in FIG. 2. As illustrated in FIG. 3, the first variable-resistance element 101 is composed of a first electrode 101a on the other end side, a first variable-resistance film 101b, and a second electrode 101c on one end side. Similarly, the second variable-resistance element 102 is composed of a first electrode 102a on another end side, a second variable-resistance film 102b, and a second electrode 102c on one end side. The rectifying element 103 is composed of a first electrode 103a on one end side, a rectifying film 103b, and a second electrode 103c on another end side. Similarly, the rectifying element 104 is composed of a first electrode 104a on one end side, a rectifying film 104b, and a second electrode 104c on another end side.

For example, the first electrodes 101a and 102a in the variable-resistance elements may be configured to comprise active electrodes supplying metal ions. Further, the first variable-resistance film 101b and the second variable-resistance film 102b in the variable-resistance elements may be configured to comprise solid electrolyte layers in which ionized metals conduct. Additionally, the second electrodes 101c and 102c in the variable-resistance elements may be configured to comprise inactive electrodes that do not react with the aforementioned metal ions.

A Poole-Frenkel type insulating film, a Schottky type insulating film, a threshold switching type volatile variable-resistance film, and the like may be used as the rectifying films 103b and 104b in the rectifying elements.

Next, an improvement factor of an erroneous write and a malfunction, according to the present invention, will be described. According to the present example embodiment, the first variable-resistance element 101 and the second variable-resistance element 102 are insulated and separated by the third terminal 113 and the first rectifying element 103. Since the third terminal 113 is a programming terminal for programming the first variable-resistance element 101 and the second variable-resistance element 102, when a voltage less than or equal to a threshold voltage V2 is applied to the first rectifying element 103, the insulation and separation of the first variable-resistance element 101 and the second variable-resistance element 102 are maintained, regardless of resistance states of the first variable-resistance element 101 and the second variable-resistance element 102. In other words, a malfunction does not occur with regard to signal transmission from the first terminal 111 to the second terminal 112.

In addition, an improvement factor of a malfunction due to a disturbance failure, according to the present invention, will be described. The disturbance failure is a failure of transitioning from an OFF-state to an ON-state due to a malfunction, and therefore it is assumed that the first variable-resistance element 101 and the second variable-resistance element 102 are in a high-resistance state. It is also assumed that a positive voltage less than or equal to a threshold voltage V1 (setting voltage) is applied to the input terminal (first terminal) 111, and the output terminal (second terminal) 112 is grounded. Voltage is applied to both ends of the variable-resistance elements, and while the first variable-resistance element 101 is applied with voltage in a direction of transition from an OFF-state to an ON-state, the second variable-resistance element 102 is applied with voltage in a direction of transition from an ON-state to an OFF-state. In other words, the direction of voltage applied to the first variable-resistance element 101 is a direction of transition to an ON-state, and therefore, when a voltage less than or equal to the threshold voltage V1 is applied, a malfunction of transitioning to an ON-state may occur, whereas the direction of voltage applied to the second variable-resistance element 102 is a direction of transitioning to an OFF-state, and therefore a malfunction does not occur.

On the other hand, when the output terminal 112 is applied with a positive voltage less than or equal to the threshold voltage V1 (setting voltage) and the input terminal 111 is grounded, the second variable-resistance element 102 is applied with voltage in a direction of transition from an OFF-state to an ON-state, whereas the first variable-resistance element 101 is applied with voltage in a direction of transition from an ON-state to an OFF-state. In other words, the direction of voltage applied to the second variable-resistance element 102 is a direction of transition to an ON-state, and therefore, when a voltage less than or equal to the threshold voltage V1 is applied, a malfunction of transitioning to an ON-state may occur, whereas the direction of voltage applied to the first variable-resistance element 101 is a direction of transition to an OFF-state, and therefore a malfunction does not occur.

In other words, in a case that either signal format is transmitted, at least one of the first variable-resistance element and the second variable-resistance element has only to maintain an OFF-state in order to interrupt a signal from the input terminal 111 to the output terminal 112, and therefore a malfunction of the switching element can be prevented. By using such a variable-resistance element, a failure due to a malfunction of a semiconductor circuit may be eliminated, and a highly reliable semiconductor device can be provided. Additionally, since applied voltage is divided between the first variable-resistance element and the second variable-resistance element, a voltage level applied to each variable-resistance element effectively becomes lower. This effect also improves a disturbance failure.

An electrical element including at least two bipolar-type variable-resistance elements illustrated in FIG. 3, in which electrodes (101c, 102c) of a same polarity in the aforementioned variable-resistance element and two rectifying elements are connected, and, at the same time, input and output are performed through two unconnected electrodes (111, 112), may be called a complementary-type variable-resistance element with rectifying element.

By configuring such a switch, a switching element in which input and output are performed by at least two unconnected terminals (111, 112) of the two variable-resistance elements inserted in a signal path, and, at the same time, resistance states of at least two variable-resistance elements are controlled by unconnected terminals (113, 114) of the rectifying element can be provided.

[Second Example Embodiment]
<Second Aspect: Crossbar Switch Array>

As a second aspect of the present invention, a crossbar switch array provided with the switching element described in the first example embodiment will be described.

Figure 4:
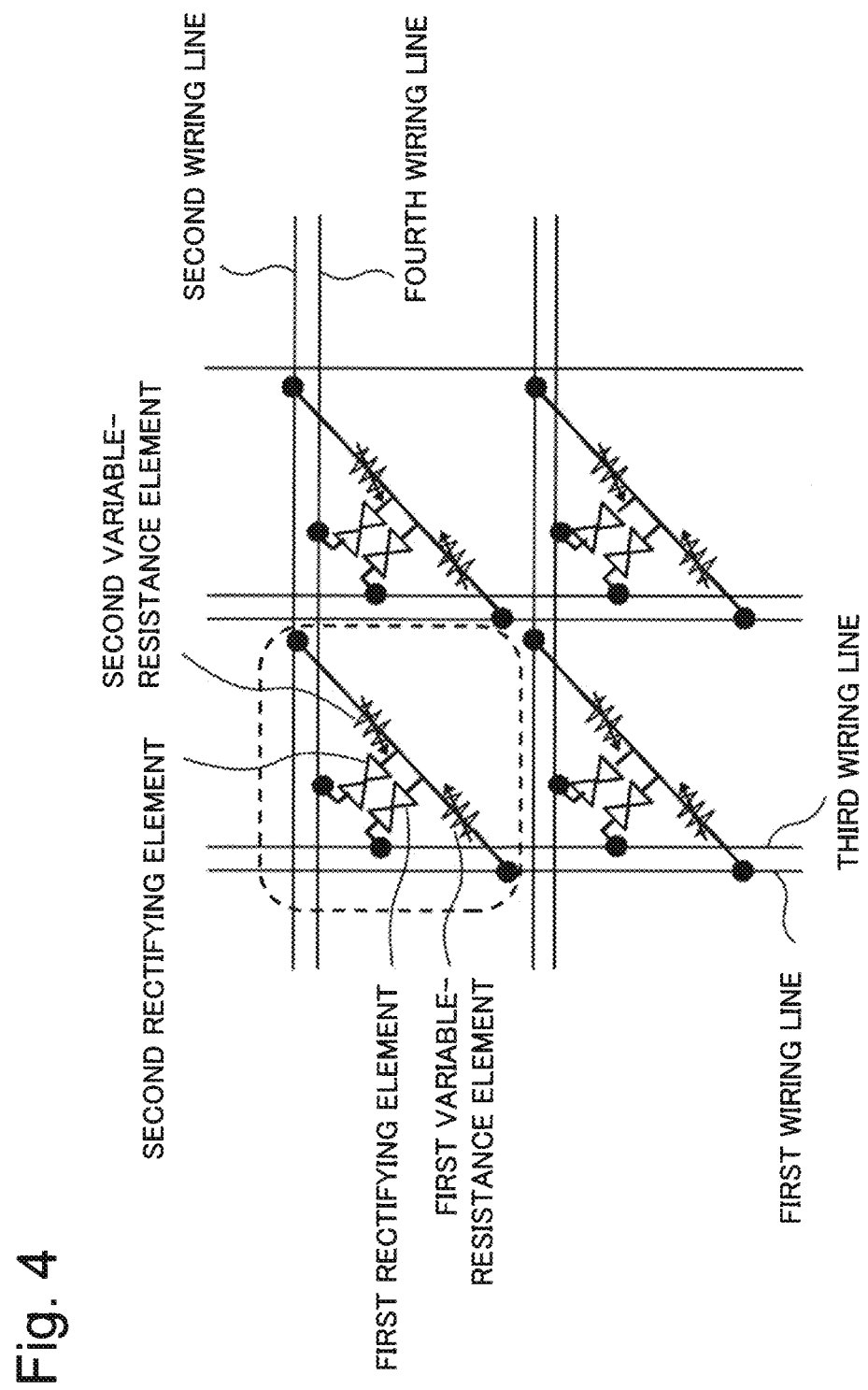
FIG. 4 is a diagram partially illustrating an example of applying the switching element according to the present invention to a crossbar switch array.

FIG. 4 is an example of a crossbar switch array according to the present invention. The crossbar switch array is a crossbar switch array in which at least two or more of the aforementioned switching elements are arranged in an array, and a plurality of switching elements share at least one of a first wiring line, a second wiring line, a third wiring line, and a fourth wiring line.

Describing a switching element in the crossbar switch array, the switching element includes the first wiring line connected to another end of a first variable-resistance element and the second wiring line connected to another end of a second variable-resistance element, and the first wiring line and the second wiring line extend in directions orthogonal to one another.

The crossbar switch array also includes the third wiring line connected to another end of a first rectifying element and the fourth wiring line connected to another end of a second rectifying element, and the third wiring line and the fourth wiring line extend in directions orthogonal to one another.

At this time, the first wiring line and the third wiring line extend in parallel with one another, and the second wiring line and the fourth wiring line extend in parallel with one another.

Such a configuration enables programming of the first variable-resistance element through the second rectifying element and programming of the second variable-resistance element through the first rectifying element.

Assuming that all the variable-resistance elements are in an OFF-state, a case that both of the first and second variable-resistance elements in the aforementioned switching element are turned to an ON-state, and an intersection point of the crossbar switch array is programmed to be in an ON-state will be described.

In the aforementioned switching element, by applying voltage between the other end of the first variable-resistance element (first wiring line) and the other end of the first rectifying element (third wiring line), a resistance state of the first variable-resistance element can be changed. Further, by applying voltage between the other end of the second variable-resistance element (second wiring line) and the other end of the second rectifying element (fourth wiring line), a resistance state of the second variable-resistance element can be changed.

When a voltage less than or equal to a programming voltage is applied to the other end of the first rectifying element or the other end of the second rectifying element, the other end of the first rectifying element (third wiring line) and the other end of the second rectifying element (fourth wiring line) are insulated and separated from the first variable-resistance element and the second variable-resistance element by the first rectifying element or the second rectifying element. Consequently, the other end of the first rectifying element and the other end of the second rectifying element are separated from a signal propagating between the other end the first variable-resistance element (first wiring line) and the other end of the second variable-resistance element (second wiring line). Thus, signal transmission is performed with the aforementioned two variable-resistance elements therebetween, and programming of the first variable-resistance element and the second variable-resistance element is performed with the second rectifying element and the first rectifying element therebetween, respectively.

Thus, by changing the resistance states of the first and second variable-resistance elements by applying voltage through the first rectifying element and the second rectifying element, a signal line for programming can be made independent of a signal line to be connected after the programming, and the first wiring line (vertical line) and the second wiring line (horizontal line) can be connected.

[Third Example Embodiment]
<Third Aspect: Device Structure>

Figure 5:
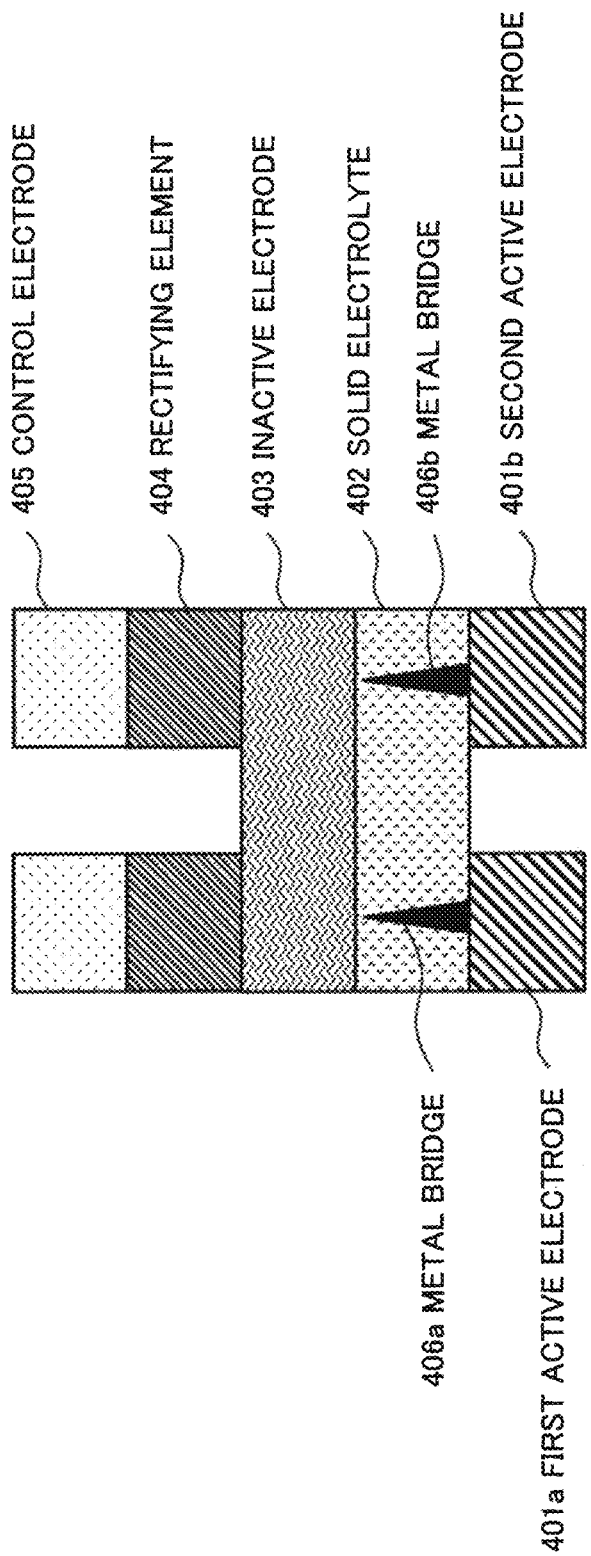
FIG. 5 is a diagram illustrating a structure example of the switching element according to the present invention.
Figure 6:
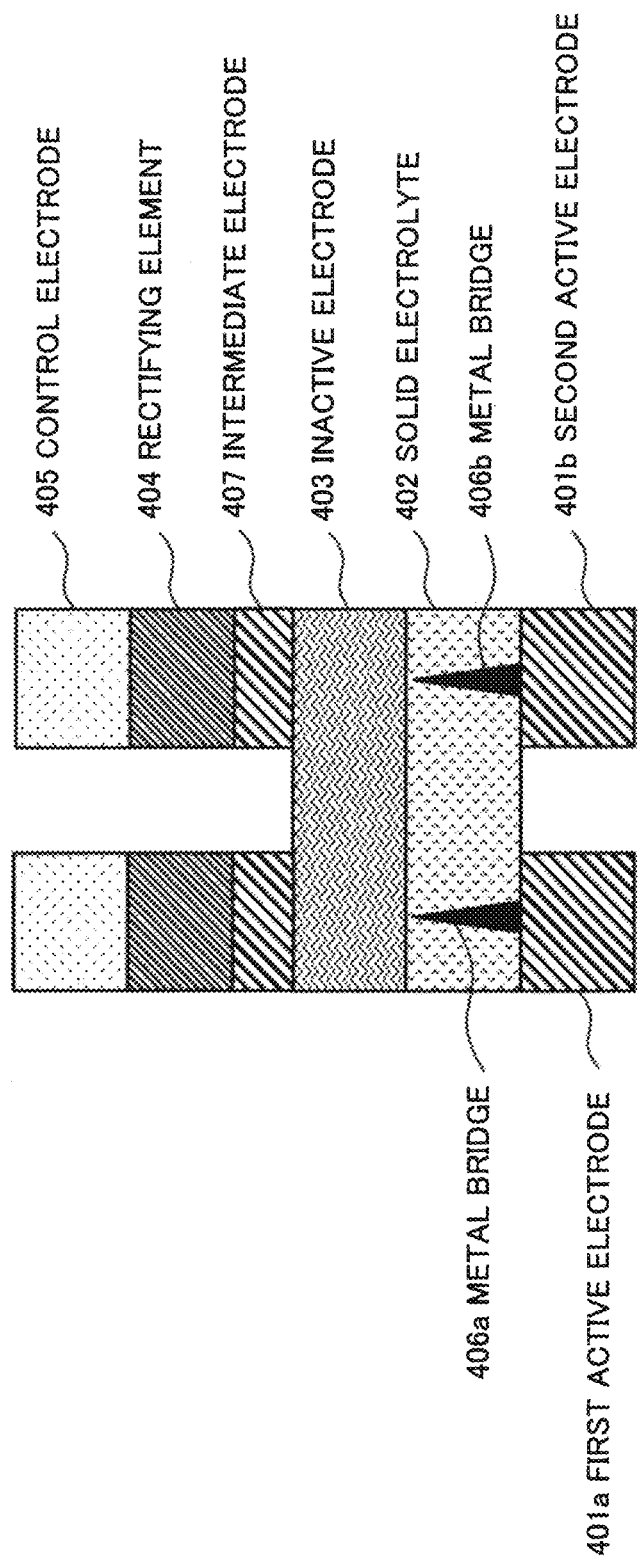
FIG. 6 is a diagram illustrating a modified example of the switching element structure in FIG. 5.

Referring to FIGS. 5 and 6, a structure of a switching element according to the present invention will be described.

In FIG. 5, the switching element includes a solid electrolyte 402 for forming first and second variable-resistance elements on two unconnected first electrodes (a first active electrode 401a and a second active electrode 401b). The switching element includes first and second rectifying elements 404 on the solid electrolyte 402 with an inactive electrode 403 therebetween, and includes a control electrode 405 on each rectifying element. Input and output of a signal is performed through the first active electrode 401a and the second active electrode 401b.

In order to turn the switching element to an ON-state (low-resistance state), metal bridges 406a and 406b are formed in the solid electrolyte 402 from the first active electrode 401a and the second active electrode 401b, respectively, by applying voltage to the control electrode 405, and thereby electrically connecting the first active electrode 401a, the inactive electrode 403, and the second active electrode 401b.

FIG. 6 is a modified example of the example in FIG. 5, and is same as the switching element in FIG. 5 except that intermediate electrodes 407 are formed between the inactive electrode 403 and, the first and second rectifying elements 404, respectively.

EXAMPLES

Example 1

Using drawings, a switching element according to an example 1 of the present invention will be described.

Figure 7:
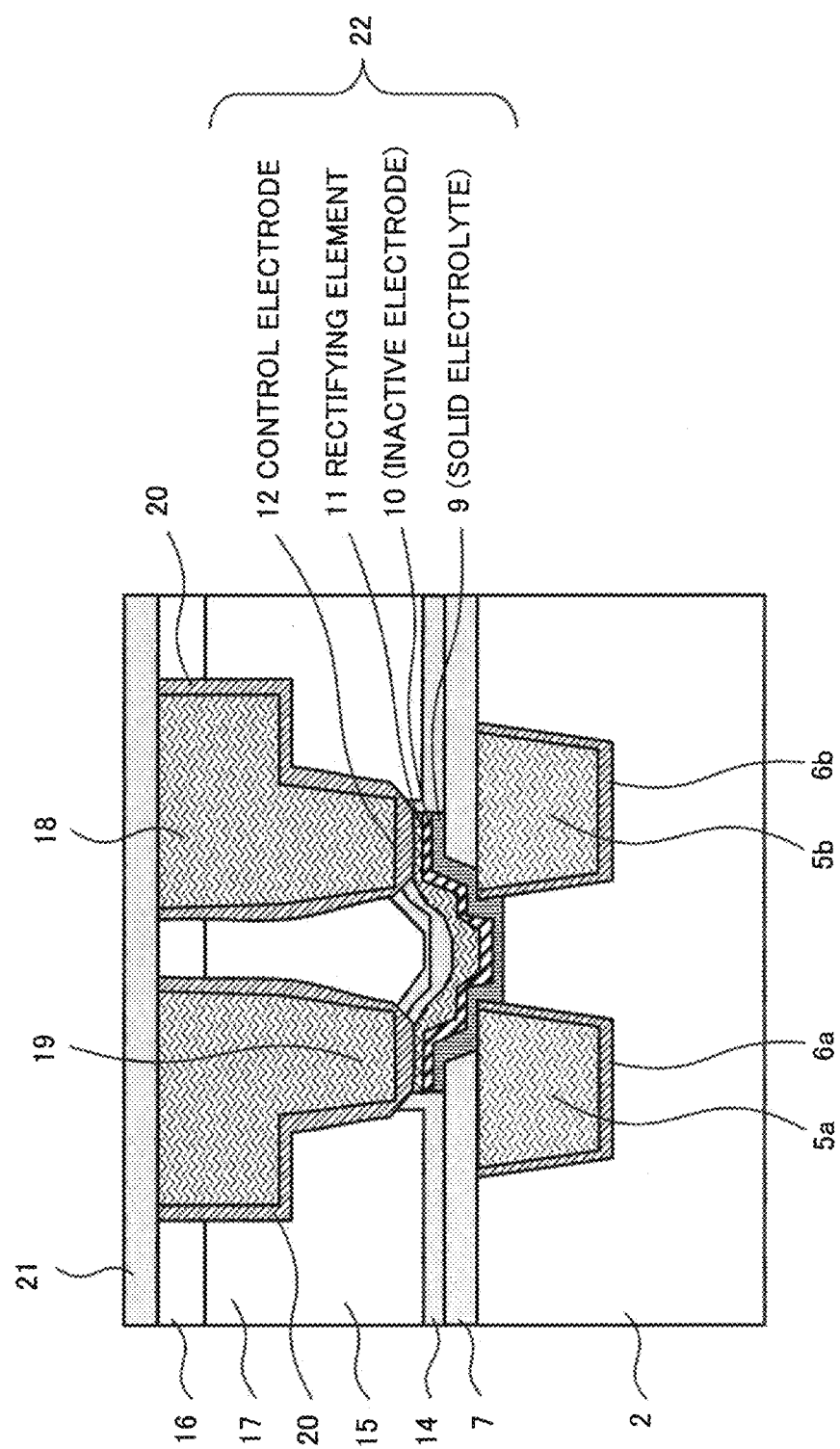
FIG. 7 is a partial cross-sectional view schematically illustrating a structure of a semiconductor device (switching element) according to an example 1 of the present invention.
Figure 8:
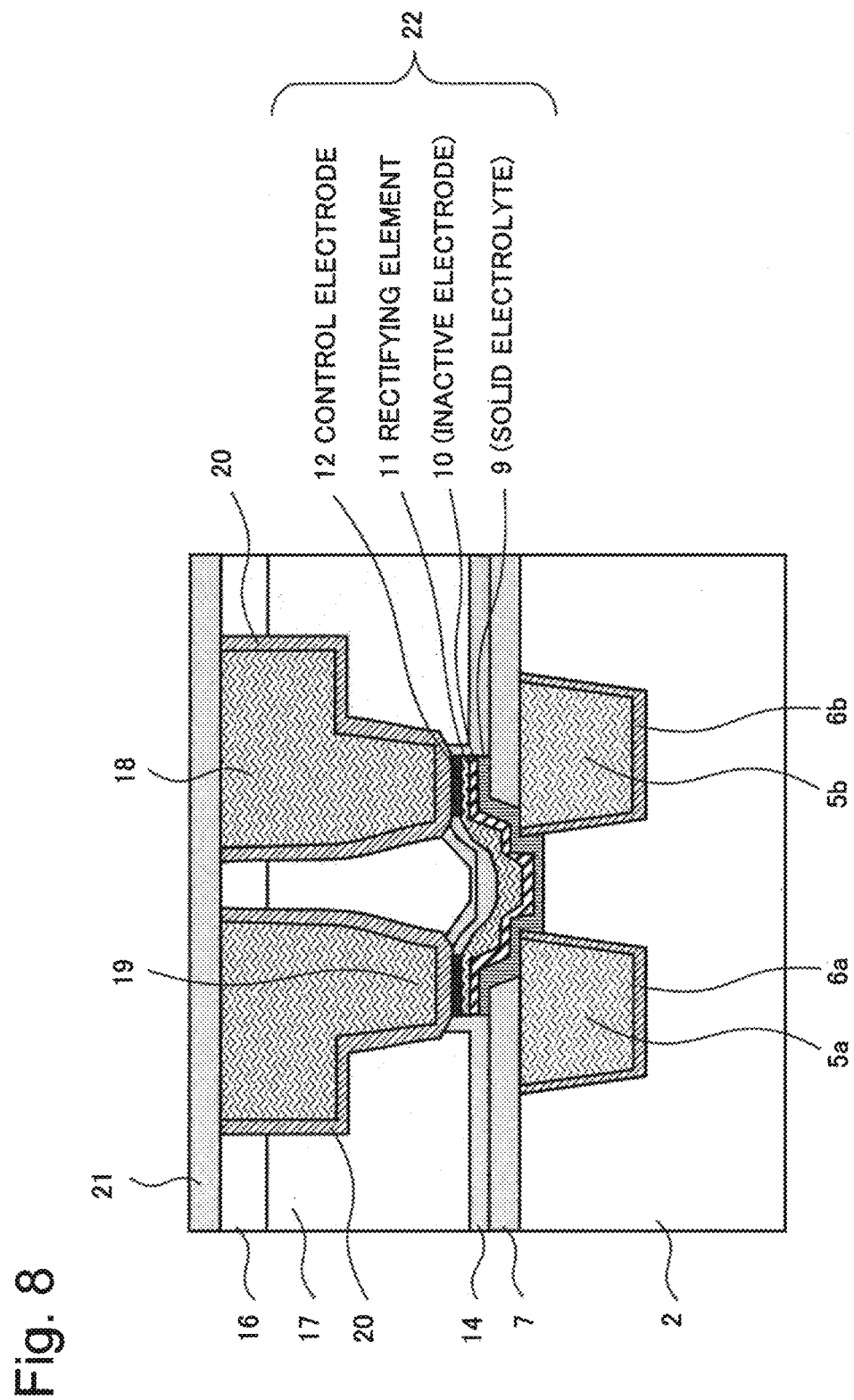
FIG. 8 is a diagram illustrating a modified example of the structure of the semiconductor device (switching element) according to the example 1 in FIG. 7.

FIG. 7 is a partial cross-sectional view schematically illustrating a structure of a semiconductor device (switching element) according to the present example of the present invention. FIG. 8 is a diagram illustrating a modified example of the structure of the switching element according to the example in FIG. 7.

The switching element according to the present example of the present invention is a device including a variable-resistance element 22 inside a multilayer wiring layer on a semiconductor substrate (unillustrated). A variable-resistance film 9 in the variable-resistance element 22 corresponds to the solid electrolyte 402 in the switching element according to the third example embodiment described in FIG. 5, and a second electrode 10 corresponds to the inactive electrode 403 in FIG. 5. A first wiring line 5a and a first wiring line 5b respectively correspond to the first active electrode 401a and the second active electrode 401b in the switching element according to the third example embodiment described in FIG. 5.

While a switching element structure related to a circuit configuration in which two variable-resistance elements are connected to two rectifying elements 11 in FIGS. 7 and 8, the number of rectifying elements may be increased depending on the number of connected variable-resistance elements.

As illustrated in FIG. 7, the multilayer wiring layer includes an insulating multilayer structure in which an interlayer insulating film 2, an insulating barrier film 7, a protective insulating film 14, an interlayer insulating film 15, an interlayer insulating film 17, a hard mask film 16, and a barrier insulating film 21 are sequentially formed in this order from the semiconductor substrate (unillustrated) side of the semiconductor substrate. In the multilayer wiring layer, first wiring lines 5a and 5b are embedded in wiring trenches formed in the interlayer insulating film 2 and the insulating barrier film 7 with barrier metals 6a and 6b therebetween. In the multilayer wiring layer, a second wiring line 18 is embedded in a wiring trench formed in the interlayer insulating film 17 and the hard mask film 16. On the other hand, as will become obvious in FIG. 10 and a description of a manufacturing method, to be described later, a plug 19 is embedded in a prepared hole formed in the interlayer insulating film 15 and the protective insulating film 14. The second wiring line 18 and the plug 19 are integrated (illustration omitted), and side surfaces and bottom surfaces of the second wiring line 18 and the plug 19 are covered by the barrier metal 20.

At an opening formed on the insulating barrier film 7 in the multilayer wiring layer, a complementary-type variable-resistance element with a rectifying element 22 in which the variable-resistance film 9, the second electrode 10, the rectifying element 11, and the control electrode (third electrode) 12 are sequentially formed in this order is formed on the first wiring lines 5a and 5b being lower electrodes, a wall surface of an opening of the insulating barrier film 7, and the insulating barrier film 7.

The protective insulating film 14 is formed on the control electrode (third electrode) 12, and a side surface of a multi-layered body composed of the variable-resistance film 9, the second electrode 10, the rectifying element 11, and the control electrode (third electrode) 12 is covered by the protective insulating film 14. By making the first wiring lines 5a and 5b as lower electrodes of the variable-resistance element 22, that is, by the first wiring lines 5a and 5b also serving as lower electrodes of the variable-resistance element 22, electrode resistance can be reduced while simplifying the number of steps. By only making at least two mask sets as an additional step to a typical Cu damascene wiring process, the variable-resistance element can be mounted, and reduction in resistance and cost of the element can be simultaneously achieved.

Note that, since the second wiring line 18 and the plug 19 are configured to be respectively connected with the barrier metal 20 therebetween in the example in FIG. 7, a part corresponding to the control electrode is illustrated as 12.

The complementary-type variable-resistance element with a rectifying element 22 is a variable-resistance type nonvolatile element, and may be considered as a switching element using metal ion movement and an electrochemical reaction in an ion conductor, according to the present example embodiment. The variable-resistance element 22 has a configuration in which the rectifying element 11 is arranged between the first wiring lines 5a and 5b being lower electrodes, and the second electrode 10 and the control electrode (third electrode) 12 that are electrically connected to the plug 19. In the variable-resistance element 22, the variable-resistance film 9 is in direct contact with the first wiring lines 5a and 5b in the opening region formed on the insulating barrier film 7, and the plug 19 and the control electrode (third electrode) 12 are electrically connected on the second electrode 10 with the barrier metal 20 therebetween. The variable-resistance element 22 performs on/off control by applying voltage or passing current, and, for example, performs on/off control by using electric field diffusion of a metal related to the first wiring lines 5a and 5b into the variable-resistance film 9.

The unillustrated semiconductor substrate is a substrate on which the semiconductor element is formed. For example, substrates such as a silicon substrate, a single-crystal substrate, a silicon on insulator (SOI) substrate, a thin film transistor (TFT) substrate, or a substrate for manufacturing a liquid crystal display, or any other similar substrate may be used as the semiconductor substrate.

The interlayer insulating film 2 is an insulating film formed on the semiconductor substrate. For example, a silicon oxide film or a low-dielectric-constant film (for example, SiOCH film) having a lower relative dielectric constant than the silicon oxide film may be used as the interlayer insulating film 2. The interlayer insulating film 2 may be a multi-layered body of a plurality of insulating films.

The insulating barrier film 7 is an insulating film formed on the interlayer insulating film 2. For example, a silicon oxide film, or a low-dielectric-constant film (for example, SiOCH film) having a lower relative dielectric constant than the silicon oxide film may be used as the insulating barrier film 7. The insulating barrier film 7 may be a multi-layered body of a plurality of insulating films.

Wiring trenches for embedding the first wiring lines are formed in the interlayer insulating film 2, and the first wiring lines 5a and 5b are embedded in the wiring trenches with the barrier metals 6a and 6b therebetween, respectively.

The first wiring lines 5a and 5b are wiring lines embedded in the wiring trenches formed in the interlayer insulating film 2 and the insulating barrier film 7 with the barrier metals 6a and 6b therebetween. The first wiring lines 5a and 5b also serve as lower electrodes of the variable-resistance element 22 and are in direct contact with the variable-resistance film 9. An electrode layer or the like may be inserted between the first wiring lines 5a and 5b, and the variable-resistance film 9. When an electrode layer is formed, the electrode layer and the variable-resistance film 9 are deposited by a continuous process and treated by a continuous process. Further, a lower part of the variable-resistance film 9 is not connected to a lower-layer wiring line through a contact plug. A metal diffusible and ion conductible in the variable-resistance film 9, such as Cu or the like, may be used as the first wiring lines 5a and 5b. The first wiring lines 5a and 5b may be alloyed with Al or Mn.

The barrier metals 6a and 6b are conductive films with a barrier property, covering side surfaces and bottom surfaces of the first wiring lines 5a and 5b in order to prevent the metal related to the wiring lines from diffusing into the interlayer insulating film 2 and a lower layer. For example, when the first wiring lines 5a and 5b are composed of a metal with Cu being a principal component, a refractory metal such as tantalum Ta, tantalum nitride TaN, titanium nitride TiN, tungsten carbonitride WCN, or a nitride thereof, or a multi-layered film thereof may be used as the barrier metals 6a and 6b.

The insulating barrier film 7 is formed on the interlayer insulating film 2 comprising the first wiring lines 5a and 5b, prevents oxidation of the metal (for example, Cu) related to the first wiring lines 5a and 5b, prevents diffusion of the metal related to the first wiring lines 5a and 5b into the interlayer insulating film 15, and plays a role as an etching stopper layer when the control electrode (third electrode) 12, the rectifying element 11, the second electrode 10, and the variable-resistance film 9 are treated. For example, an SiC film, an SiCN film, an SiN film, and a multi-layered structure thereof may be used as the insulating barrier film 7. It is preferable that the insulating barrier film 7 be of a same material as the protective insulating film 14 and the hard mask film 16.

The insulating barrier film 7 includes an opening on the first wiring lines 5a and 5b. The first wiring lines 5a and 5b are in contact with the variable-resistance film 9 at the opening of the insulating barrier film 7. The opening of the insulating barrier film 7 is formed in regions of the first wiring lines 5a and 5b. Such a structure enables formation of the variable-resistance element 22 on the surfaces of the first wiring lines 5a and 5b, the surfaces having small unevenness. The wall surface of the opening of the insulating barrier film 7 is a tapered surface a width of which becomes wider as a distance from the first wiring lines 5a and 5b becomes longer. The tapered surface of the opening of the insulating barrier film 7 is set to make 85° or less with respect to top surfaces of the first wiring lines 5a and 5b. Such a structure alleviates electric field concentration on an outer periphery of a connecting part of the first wiring lines 5a and 5b and the variable-resistance film 9 (around an outer peripheral part of the opening of the insulating barrier film 7), enabling improvement in dielectric strength property.

The variable-resistance film 9 is a film with varying resistance. A material that varies resistance by an action (for example, diffusion and ion conduction) of the metal related to the first wiring lines 5a and 5b (lower electrode) may be used as the variable-resistance film 9. When resistance of the variable-resistance film 9 is varied by precipitation of a metal ion, an ion conductible film such as an oxide insulating film including Ta, such as $Ta_2O_5$ or TaSiO, may be used as the variable-resistance film 9. Further, the variable-resistance film 9 may have a multi-layered structure in which $Ta_2O_5$ and TaSiO are sequentially formed in this order from the bottom. With such a multi-layered structure, when the variable-resistance film 9 is used as a solid electrolyte, metal ions may be readily collected in an OFF-state by dividing a bridge formed inside the ion conduction layer in a low-resistance state (ON-state) by metal ions (for example, copper ions) by the $Ta_2O_5$ layer, and a switching characteristic can be improved. The variable-resistance film 9 is formed on the first wiring lines 5a and 5b, the tapered surface of the opening of the insulating barrier film 7, and the insulating barrier film 7. With regard to the variable-resistance film 9, an outer peripheral part of a connecting part of the first wiring lines 5a and 5b, and the variable-resistance film 9 is arranged at least along the tapered surface of the opening of the insulating barrier film 7.

In the second electrode 10, it is preferable to use a metal less likely to ionize than the metal related to the first wiring lines 5a and 5b, and less diffusible and less ion conductible in the variable-resistance film 9 as an electrode on the lower-layer side in direct contact with the variable-resistance film 9. For example, Pt or Ru may be used as such an electrode. Further, RuTa, RuTi, or the like with a metal material such as Pt or Ru being a principal component may be used as such an electrode, and Ta, Ti, or the like may be inserted at an interface between the second electrode 10 and the rectifying element for controlling a work function.

The second electrode 10 is in direct contact with the variable-resistance film 9 on one surface, and is in direct contact with the rectifying element 11 on the other surface. The second electrode 10 may have a multi-layered structure. For example, the second electrode 10 may have a multi-layered structure of an electrode on the lower-layer side in direct contact with the variable-resistance film 9 and an electrode on the upper-layer side in direct contact with the rectifying element 11. For example, Ru, RuTa, RuTi, or a nitride thereof may be used as the electrode on the lower-layer side, and Ta, Ti, or a nitride thereof may be used as the electrode on the upper-layer side. The structure is able to prevent Ru from being exposed to an oxygen atmosphere from the top surface in a case that the rectifying element is an oxide.

In the second electrode 10, considering work functions of the rectifying element 11 and the second electrode 10, for example, Ta, TaN, Ti, or TiN may be used as the electrode on the upper-layer side in direct contact with the rectifying element 11.

As described in FIG. 3, the rectifying element 11 comprises a rectifying film, and a Poole-Frenkel type insulating film, a Schottky type insulating film, a threshold switching type volatile variable-resistance film, or the like may be used as the rectifying film. For example, titanium oxide ($TiO_x$), tantalum oxide ($TaO_x$), tungsten oxide ($WO_x$), molybdenum oxide ($MoO_x$), hafnium oxide ($HfO_x$), aluminum oxide ($AlO_x$), zirconium oxide ($ZrO_x$), yttrium oxide ($Y_2O_3$), manganese oxide ($MnO_x$), niobium oxide ($NbO_x$), a silicon nitride film (SiN), a silicon carbonitride film (SiCN), a silicon oxide film ($SiO_x$), or a film containing either of silicon or germanium may be used as the rectifying film. Alternatively, a multi-layered film containing the above may be used.

Since Ta is used as the electrode, TaO particularly has an advantage over a case using another material in terms of film-forming and treatment. SiN is also a material commonly used in a semiconductor device and has an advantage in terms of ease of growth and ease of treatment by dry etching.

For example, Ta, Ti, W, Al, or a nitride thereof may be used as the control electrode (third electrode) 12. It is preferable that the control electrode (third electrode) 12 be of a same material as the barrier metal 20. The control electrode (third electrode) 12 is electrically connected to the plug 19 with the barrier metal 20 therebetween.

It is preferable that the protective insulating film 14 and the insulating barrier film 7 are of a same material. That is to say, surrounding an entire periphery of the variable-resistance element 22 with a same material provides an integrated material interface, and ingress of external moisture and the like can be prevented and elimination from the variable-resistance element 22 itself can also be prevented.

The protective insulating film 14 is an insulating film having a function of further preventing elimination of oxygen from the variable-resistance film 9 without damaging the variable-resistance element 22. For example, an SiN film or an SiCN film may be used as the protective insulating film 14. It is preferable that the protective insulating film 14 be of a same material as the insulating barrier film 7. When the two are of a same material, the protective insulating film 14, and the insulating barrier film 7 and the hard mask film 16 are integrated by the interfaces therebetween being continuous, and adhesion of the interfaces is improved, resulting in better protection of the variable-resistance element 22.

The interlayer insulating film 15 is an insulating film formed on the protective insulating film 14. For example, a silicon oxide film ($SiO_x$), an SiOC film, or a low-dielectric-constant film (for example, an SiOCH film) having a lower relative dielectric constant than the silicon oxide film may be used as the interlayer insulating film 15. The interlayer insulating film 15 may be a multi-layered body of a plurality of insulating films. The interlayer insulating film 15 may be of a same material as the interlayer insulating film 17 formed thereon. A prepared hole for embedding the plug 19 is formed in the interlayer insulating film 15, and the plug 19 is embedded in the prepared hole with the barrier metal 20 therebetween.

For example, a silicon oxide film, an SiOC film, a low-dielectric-constant film (for example, an SiOCH film) having a lower relative dielectric constant than the silicon oxide film may be used as the interlayer insulating film 17.

The interlayer insulating film 17 may be a multi-layered body of a plurality of insulating films. The interlayer insulating film 17 may be of a same material as the interlayer insulating film 15. A wiring trench for embedding the second wiring line 18 is formed in the interlayer insulating film 17, and the second wiring line 18 is embedded in the wiring trench with the barrier metal 20 therebetween.

The second wiring line 18 is a wiring line embedded in the wiring trench formed in the interlayer insulating film 17 with the barrier metal 20 therebetween. The second wiring line 18 is integrated with the plug 19. The plug 19 is embedded in the prepared hole formed in the interlayer insulating film 15, the protective insulating film 14, and the hard mask film 16 with the barrier metal 20 therebetween. The plug 19 is electrically connected to the second electrode 10 with the rectifying element 11 therebetween. For example, Cu may be used as the second wiring line 18 and the plug 19.

The barrier metal 20 is a conductive film with a barrier property, covering the side surfaces and the bottom surfaces of the second wiring line 18 and the plug 19 in order to prevent a metal related to the second wiring line 18 (comprising the plug 19) from diffusing into the interlayer insulating films 15 and 17, and a lower layer. For example, when the second wiring line 18 and the plug 19 are composed of a metal with Cu being a principal component, a refractory metal such as tantalum Ta, tantalum nitride TaN, titanium nitride TiN, tungsten carbonitride WCN, or a nitride thereof, or a multi-layered film thereof may be used as the barrier metal 20. It is preferable that the barrier metal 20 be of a same material as the control electrode (third electrode) 12. For example, when the barrier metal 20 is a multi-layered structure of TaN (lower layer)/Ta (upper layer), it is preferable to use TaN being a lower layer material as the control electrode (third electrode) 12. Alternatively, when the barrier metal 20 is Ti (lower layer)/Ru (upper layer), it is preferable to use Ti being a lower layer material as the second electrode 10.

The barrier insulating film 21 is an insulating film that is formed on the interlayer insulating film 17 comprising the second wiring line 18, and plays a role of preventing oxidation of the metal (for example, Cu) related to the second wiring line 18 and also preventing the metal related to the second wiring line 18 from diffusing into an upper layer. For example, an SiC film, an SiCN film, an SiN film, and a multi-layered structure thereof may be used as the barrier insulating film 21.

FIG. 8 illustrates a modified example of FIG. 7, and is same as the example in FIG. 7 except that a control electrode 12 is formed in a region between a rectifying element 11 and a barrier metal 20.

Example 2

Figure 9:
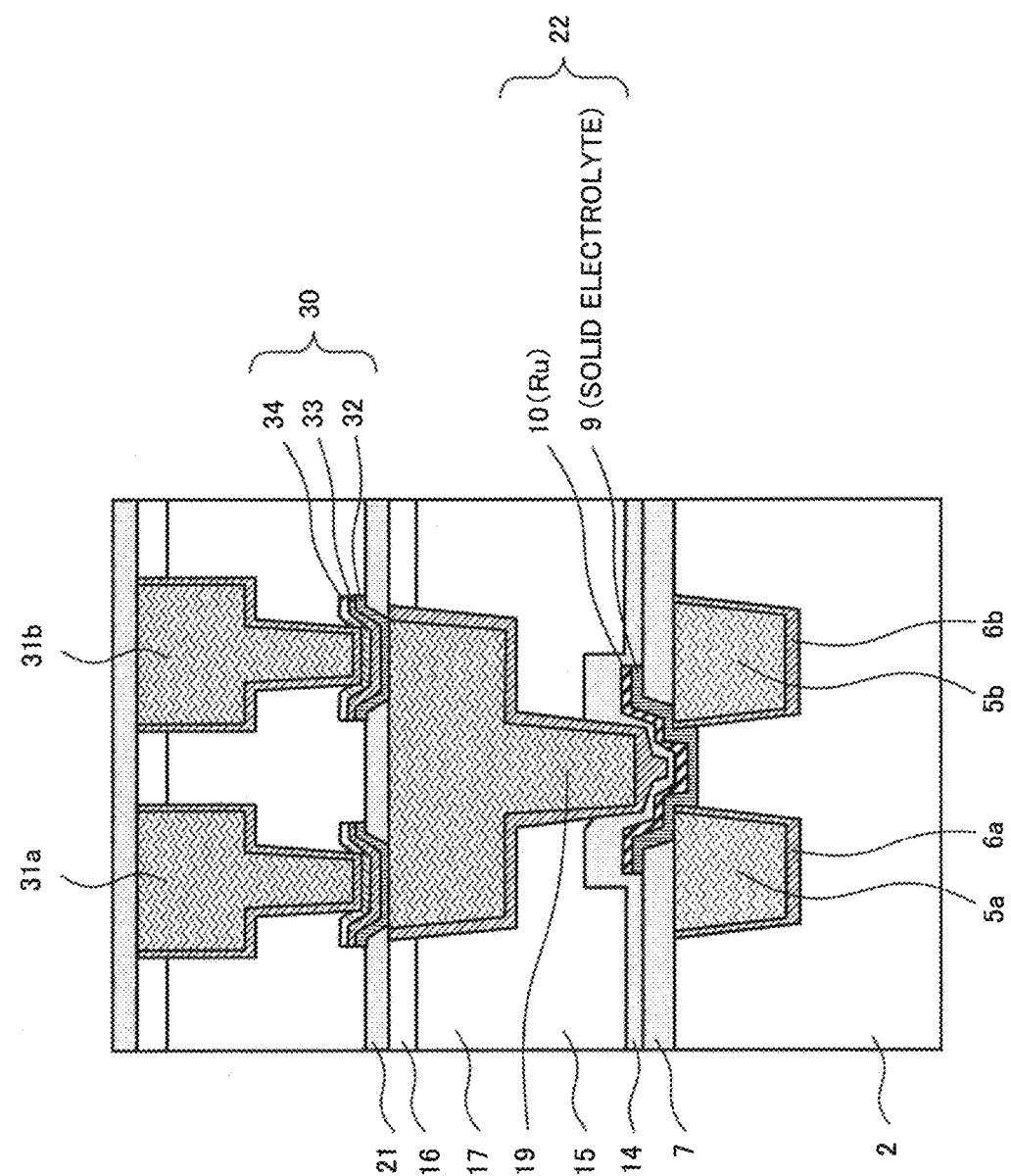
FIG. 9 is a partial cross-sectional view schematically illustrating a structure of a semiconductor device (switching element) according to an example 2 of the present invention.

FIG. 9 is a cross-sectional view of a switching element according to an example 2. The switching element is configured to form and arrange a variable-resistance element and a rectifying element in different wiring layers, and then connect the two with a copper wiring line therebetween. In a copper wiring line in a lower layer, a complementary-type variable-resistance element 22 composed of a variable-resistance film 9 and an upper electrode (second electrode) 10 is formed on a first wiring line 5a and another first wiring line 5b, being a lower electrode, at an opening formed on an insulating barrier film 7. The upper electrode 10 is connected to intermediate copper wiring lines 31a and 31b with a plug 19 of copper therebetween.

The plug 19 is embedded in a prepared hole formed in an interlayer insulating film 15 and a protective insulating film 14 with a barrier metal 20 therebetween. The prepared hole formed in the protective insulating film 14 is arranged between two openings of the insulating barrier film 7, in a plan view. Then, the second electrode 10 is electrically connected with the barrier metal 20 therebetween.

At the intermediate copper wiring lines 31a and 31b, rectifying elements 30 are formed by sequentially forming lower electrodes 32, rectifying films 33, and control electrodes (third electrodes) 34 in this order on one plug (second wiring line) 19 being an intermediate electrode at two openings formed on a barrier insulating film 21.

Figure 10:
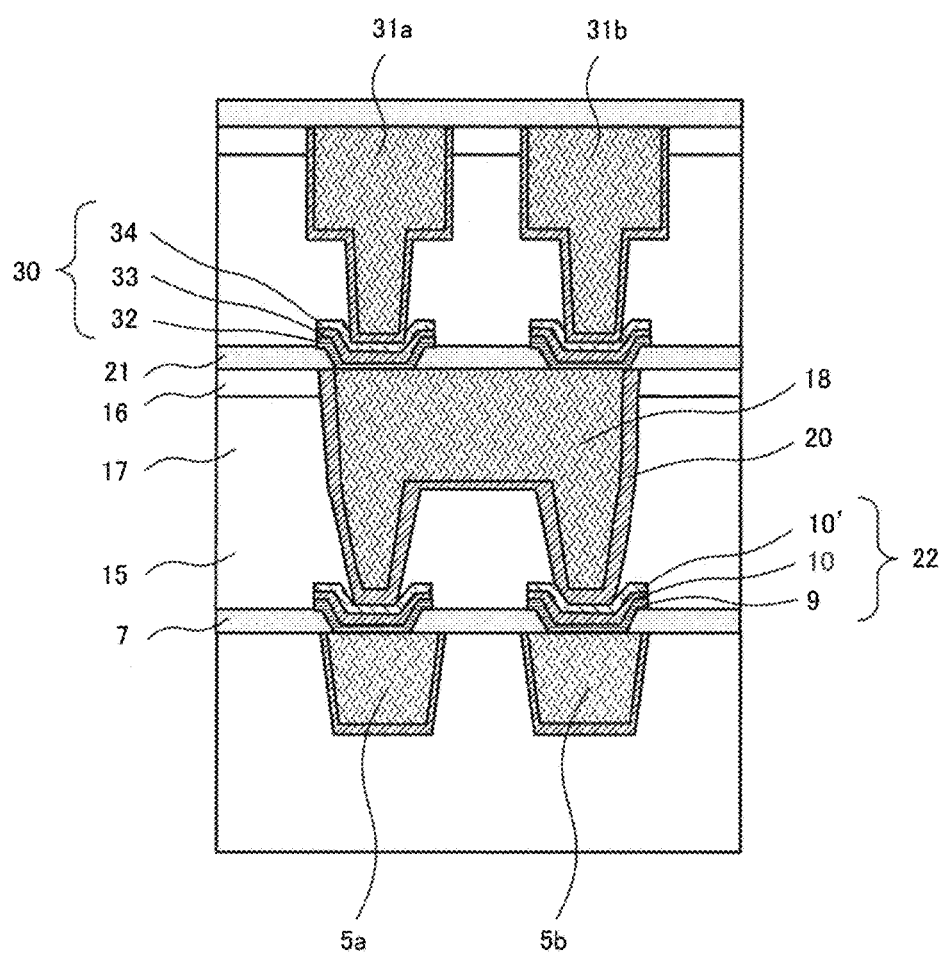
FIG. 10 is a diagram illustrating a modified example of the structure of the semiconductor device (switching element) according to the example 2 in FIG. 9.

FIG. 10 is a modified example of the variable-resistance element in FIG. 9. The modified example differs from the device, illustrated in FIG. 7, including the variable-resistance element 22 inside the multilayer wiring layer on the semiconductor substrate in that there are two openings on an insulating barrier film 7.

Specifically, two openings are formed on an insulating barrier film 7, being related to first wiring lines 5a and 5b being lower electrodes, and a complementary-type variable-resistance element 22 in which a variable-resistance film 9, a second electrode 10, and an electrode 10' of a material different from the second electrode 10 are sequentially formed in this order is formed on wall surfaces of the two openings of the insulating barrier film 7 and the insulating barrier film 7. A second wiring line 18 is embedded in a prepared hole formed in an interlayer insulating film 15. On the second electrode 10', the second wiring line 18 and the second electrode 10' are electrically connected with a barrier metal 20 therebetween.

The second electrode 10' is connected to intermediate copper wiring lines 31a and 31b with the second wiring line 18 therebetween.

Similarly to FIG. 9, at the intermediate copper wiring lines 31a and 31b, rectifying elements 30 are formed by sequentially forming one second wiring line 18 being an intermediate electrode, lower electrodes 32, rectifying films 33, and control electrodes (third electrodes) 34 in this order at two openings formed on a barrier insulating film 21.

Example 3

Next, a manufacturing method of the semiconductor device in FIG. 8 described as the example 1 will be described by using FIGS. 11(A) to 11(C), FIGS. 12(A) to 12(C), FIGS. 13(A) to 13(C), and FIGS. 14(A) to 14(C). The manufacturing method according to the present example 3 is an example for forming a semiconductor device according to the present invention. FIGS. 11(A) to 11(C), FIGS. 12(A) to 12(C), FIGS. 13(A) to 13(C), and FIGS. 14(A) to 14(C) are cross-sectional views schematically illustrating steps of an example of a manufacturing method of the semiconductor device according to the present invention.

First, an interlayer insulating film 2 (for example, a silicon oxide film with a film thickness of 500 nm) is deposited on a semiconductor substrate (for example, a substrate on which a semiconductor element is formed). Then, wiring trenches are formed on the interlayer insulating film 2 by using a lithography method (comprising photoresist formation, dry etching, and photoresist removal). Then, first wiring lines 5a and 5b (for example, copper) (hereinafter collectively referred to as first wiring lines 5) are embedded in the wiring trenches with barrier metals 6a and 6b therebetween (for example, a TaN/Ta multi-layered film with film thicknesses of 5 nm/5 nm) (hereinafter collectively referred to as barrier metals 6).

The interlayer insulating film 2 may be formed by a plasma-enhanced chemical vapor deposition (CVD) method. For example, the plasma-enhanced CVD method is a technique of continuously supplying a gas material or a liquid material to a reaction chamber at reduced pressure by vaporizing the material, bringing a molecule to an excited state by plasma energy, and forming a continuous film on a substrate by a gas phase reaction, a substrate surface reaction, or the like.

Further, for example, the first wiring line 5 may be formed by forming the barrier metal 6 (for example, a TaN/Ta multi-layered film) by a physical vapor deposition (PVD) method, burying copper in the wiring trench by an electrolytic plating method after formation of a Cu seed by the PVD method, and removing excess copper not existing inside the wiring trench by a chemical mechanical polishing (CMP) method after heat treatment at a temperature of 200° C. or higher. Common techniques in the relevant technical fields may be used in such a series of copper wiring line forming methods. The CMP method is a method of planarization by bringing unevenness of a wafer surface generated in a multilayer wiring forming process into contact with a rotating polishing pad to be polished, while flowing a polishing solution on the wafer surface. An embedded wiring line (damascene wiring line) is formed by polishing excess copper embedded in a trench, and planarization is performed by polishing an interlayer insulating film (FIG. 11(A)).

Figure 11:
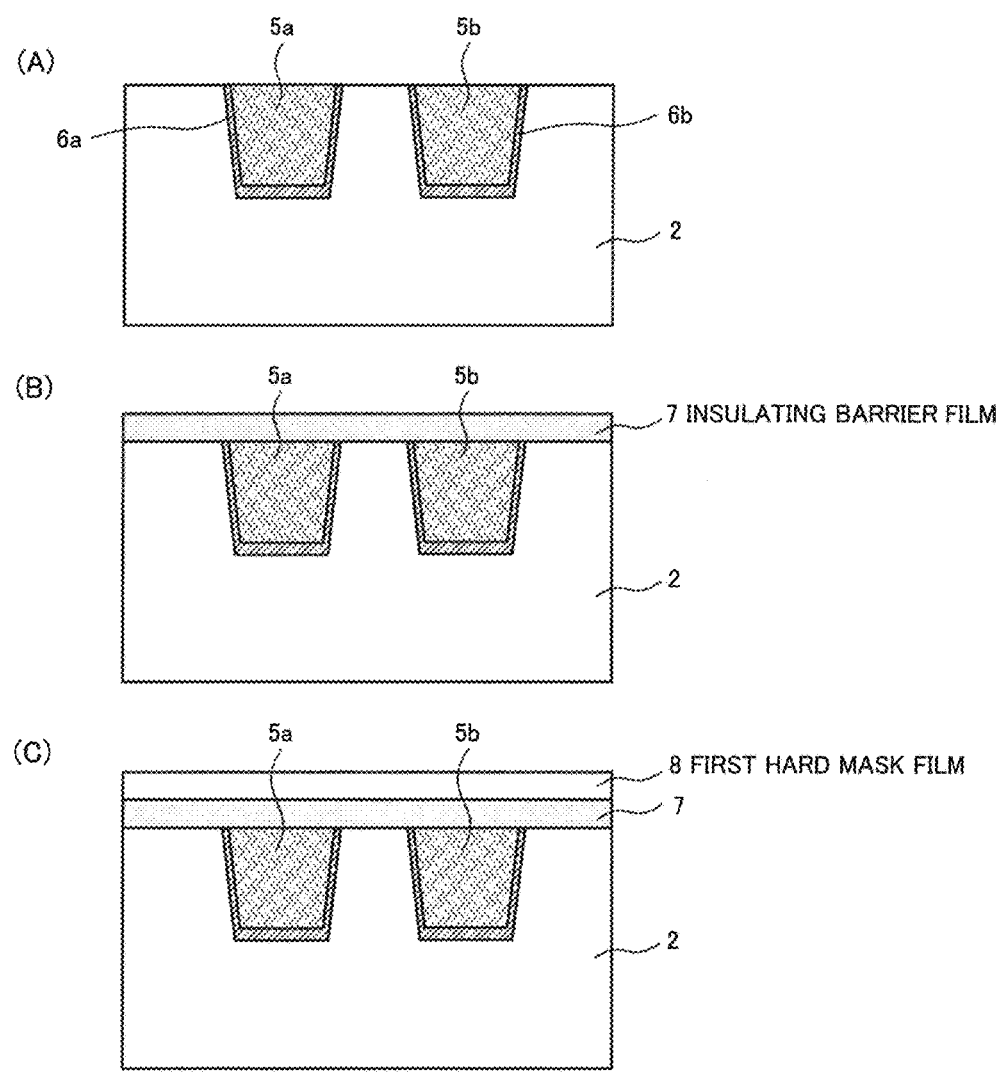
FIGS. 11(A) to 11(C) are cross-sectional views for illustrating steps of a manufacturing method of the semiconductor device according to the example in FIG. 8.

Next, an insulating barrier film 7 (for example, an SiCN film with a film thickness of 30 nm) is formed on the interlayer insulating film 2 comprising the first wiring line 5 (FIG. 11(B)). The insulating barrier film 7 may be formed by the plasma-enhanced CVD method. It is preferable that a film thickness of the insulating barrier film 7 be around 10 nm to 50 nm.

Next, a first hard mask film 8 (for example, a silicon oxide film) is formed on the insulating barrier film 7 (FIG. 11(C)). At this time, it is preferable that the first hard mask film 8 be of a material different from the insulating barrier film 7 from the viewpoint of keeping an etching selection ratio high in dry etching treatment, and the first hard mask film 8 may be an insulating film or a conductive film. For example, a silicon oxide film, a silicon nitride film, TiN, Ti, Ta, or TaN may be used as the first hard mask film 8, and also a multi-layered body of SiN/SiO$_2$ may be used.

Next, patterning of an opening is performed on the first hard mask film 8 by using a photoresist (unillustrated). An opening pattern is formed on the first hard mask film 8 by performing dry etching with the photoresist used as a mask, and then the photoresist is stripped by oxygen plasma ashing or the like (FIG. 12(A)). At this time, the dry etching does not necessarily need to stop at a top surface of the insulating barrier film 7, and may reach inside the insulating barrier film 7.

Figure 12:
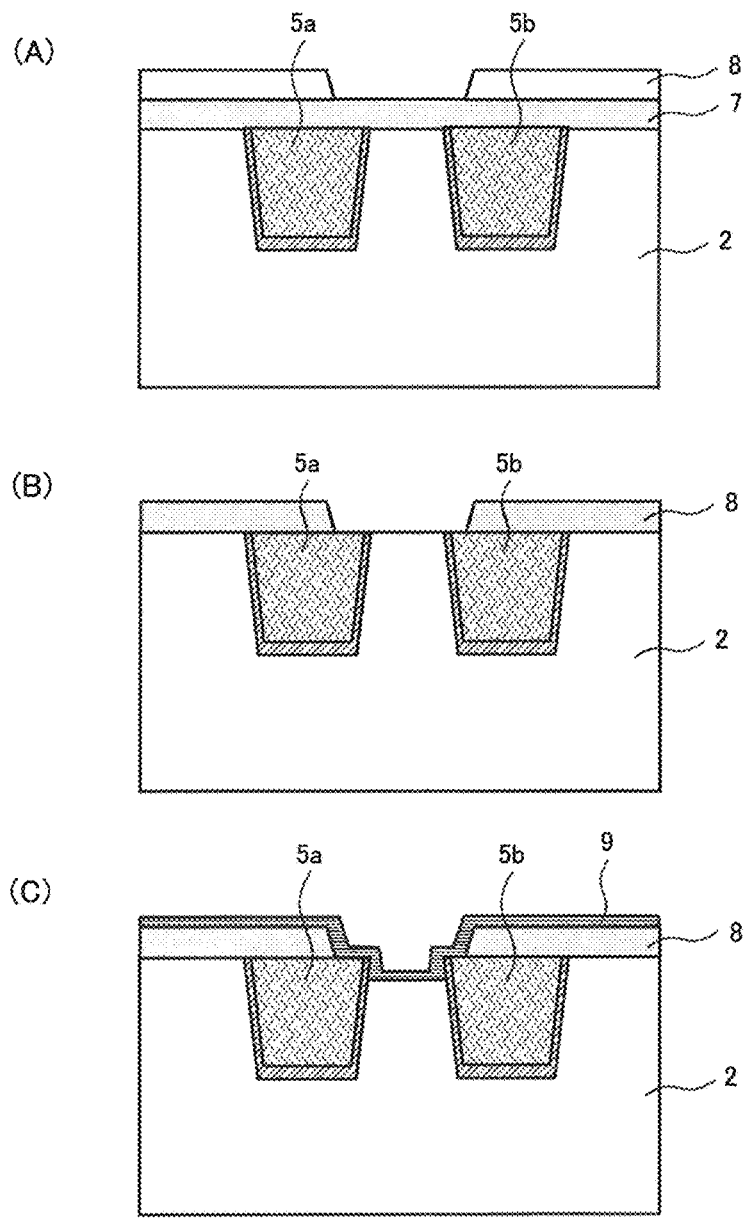
FIGS. 12(A) to 12(C) are cross-sectional views for illustrating steps of the manufacturing method, following FIGS. 11(A) to 11(C).

Next, with the first hard mask film 8 obtained by performing patterning on the opening illustrated in FIG. 12(A) used as a mask, an opening is formed on the insulating barrier film 7 by etching back (dry etching) the insulating barrier film 7 exposed from the opening of the first hard mask film 8, and the first wiring line 5 is exposed from the opening of the insulating barrier film 7. At this time, the opening of the insulating barrier film 7 may reach inside the interlayer insulating film 2. Then, by performing organic stripping treatment with an amine-based stripping solution or the like, copper oxide formed on the exposed surface of the first wiring line 5 is removed, and a by-product of etching generated during the etch back and the like are also removed (referring to FIG. 12(B)).

While it is preferable that the first hard mask film 8 in FIG. 12(A) be completely removed during the etch back, the film may remain intact in a case that the film is of an insulating material. Further, a shape of the opening of the insulating barrier film 7 may be a circle, a square, or a quadrangle, and a diameter of the circle or a length of a side of the quadrangle may range from 20 nm to 500 nm.

Further, in the etch back of the insulating barrier film 7, a wall surface of the opening of the insulating barrier film 7 may be formed as a tapered surface by using reactive dry etching. In the reactive dry etching, a gas containing fluorocarbon may be used as an etching gas.

Next, a variable-resistance film 9 is deposited on the insulating barrier film 7 comprising the first wiring line 5. The variable-resistance film 9 is a solid electrolyte and, for example, SiCOH, TaSiO, Ta$_2$O$_5$, ZrO, or HfO, (a film thickness of 6 nm) may be used (FIG. 12(C)). The variable-resistance film 9 may be formed by using the PVD method or the CVD method.

Since moisture and the like are adhered to the opening of the insulating barrier film 7 due to organic stripping treatment, it is preferable to perform degassing by applying heat treatment at reduced pressure at a temperature around 250° C. to 400° C. before the deposition of the variable-resistance film 9. At this time, a precaution such as performing treatment in a vacuum or in a nitrogen atmosphere should be taken not to oxidize the copper surface again.

Further, plasma cleaning or gas cleaning treatment using an H$_2$ gas may be performed on the first wiring line 5 exposed from the opening of the insulating barrier film 7 before the deposition of the variable-resistance film 9. Such treatment enables suppression of oxidation of the first wiring line 5 (Cu) in formation of the variable-resistance film 9, and enables suppression of thermal diffusion (mass transfer) of copper in the process.

Further, oxidation of the first wiring line 5 (Cu) may be suppressed by depositing a thin-film valve metal (2 nm or less) (unillustrated) by using the PVD method before the deposition of the variable-resistance film 9. The valve metal is composed of at least one of Zr, Hf, Ti, Al, Ta, and the like, and may be selected from materials having free energy of oxidation greater than Cu in a negative direction. The thin-film valve metal layer becomes an oxide by being oxidized during the formation of the variable-resistance film 9.

Further, since the variable-resistance film 9 needs to be embedded with good coverage into an opening having a level difference, it is preferable to use the plasma-enhanced CVD method.

Next, a second electrode 10 with a multi-layered structure is formed on the variable-resistance film 9. The second electrode 10 may be deposited in two separate steps, one for an electrode on the lower-layer side (for example, a layer with Ru being a principal component, with a film thickness of 10 nm) in direct contact with the variable-resistance film 9, and the other for an electrode on the upper-layer side (for example, titanium nitride with a film thickness of 10 nm). Additionally, a rectifying element 11 and a third electrode (control electrode) 12 are formed in this order (referring to FIG. 13(A)).

A second hard mask film 8-2 (for example, an SiCN film with a film thickness of 30 nm) and a third hard mask film (another hard mask film) 8-3 (for example, an SiO$_2$ film with a film thickness of 200 nm) are sequentially formed in this order on the third electrode (control electrode) 12. The second hard mask film 8-2 and the third hard mask film 8-3 may be formed by using the plasma-enhanced CVD method. The hard mask films may be formed by using a common plasma-enhanced CVD method in the relevant technical field. Further, it is preferable that the second hard mask film 8-2 and the third hard mask film 8-3 be of different types of films, and, for example, the second hard mask film 8-2 may be an SiCN film and the third hard mask film 8-3 may be an $SiO_2$ film. At this time, it is preferable that the second hard mask film 8-2 be of a same material as a protective insulating film 14 and the insulating barrier film 7. That is to say, surrounding an entire periphery of a variable-resistance element with a same material provides an integrated material interface, and ingress of external moisture and the like can be prevented and elimination from the variable-resistance element itself can also be prevented. Further, while the second hard mask film 8-2 may be formed by the plasma-enhanced CVD method, the film needs to be maintained at reduced pressure in a reaction chamber before film-forming, and, this poses an issue that oxygen is eliminated from the variable-resistance film 9, and leak current of the solid electrolyte increases due to an oxygen defect. In order to suppress such leak current, it is preferable that a film-forming temperature be 400° C. or less. Additionally, since exposure to a film-forming gas occurs at reduced pressure before the formation of the hard mask film, it is preferable not to use a reducing gas. For example, it is preferable to use an SiN film formed with high-density plasma of a mixed gas of $SiH_4/N_2$, or the like.

Further, a metal hard mask such as TiN may be used as the hard mask.

Figure 13:
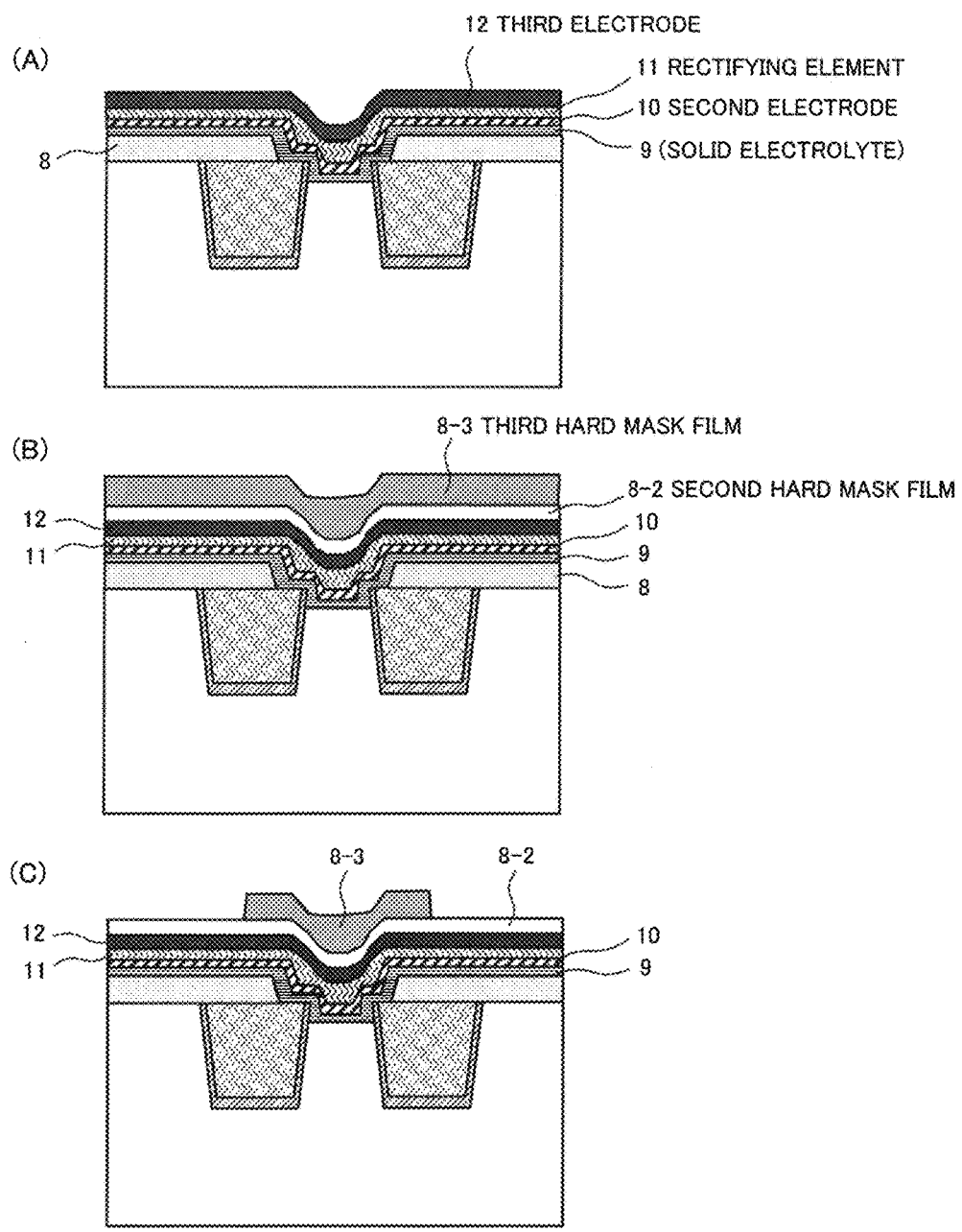
FIGS. 13(A) to 13(C) are cross-sectional views for illustrating steps of the manufacturing method, following FIGS. 12(A) to 12(C).

Next, a photoresist (unillustrated) for patterning of a variable-resistance element part is formed on the third hard mask film 8-3, and then the third hard mask film 8-3 is dry etched with the photoresist used as a mask until the second hard mask film 8-2 appears, and then the photoresist is removed by using oxygen plasma ashing and organic stripping (referring to FIG. 13(C)).

Next, a photoresist (unillustrated) for patterning of a rectifying element part is formed on the third hard mask film 8-3, and then dry etching is performed with the photoresist used as a mask, in order to transfer a rectifying element pattern into the third hard mask film 8-3, and then the photoresist is removed by using oxygen plasma ashing and organic stripping.

Figure 14:
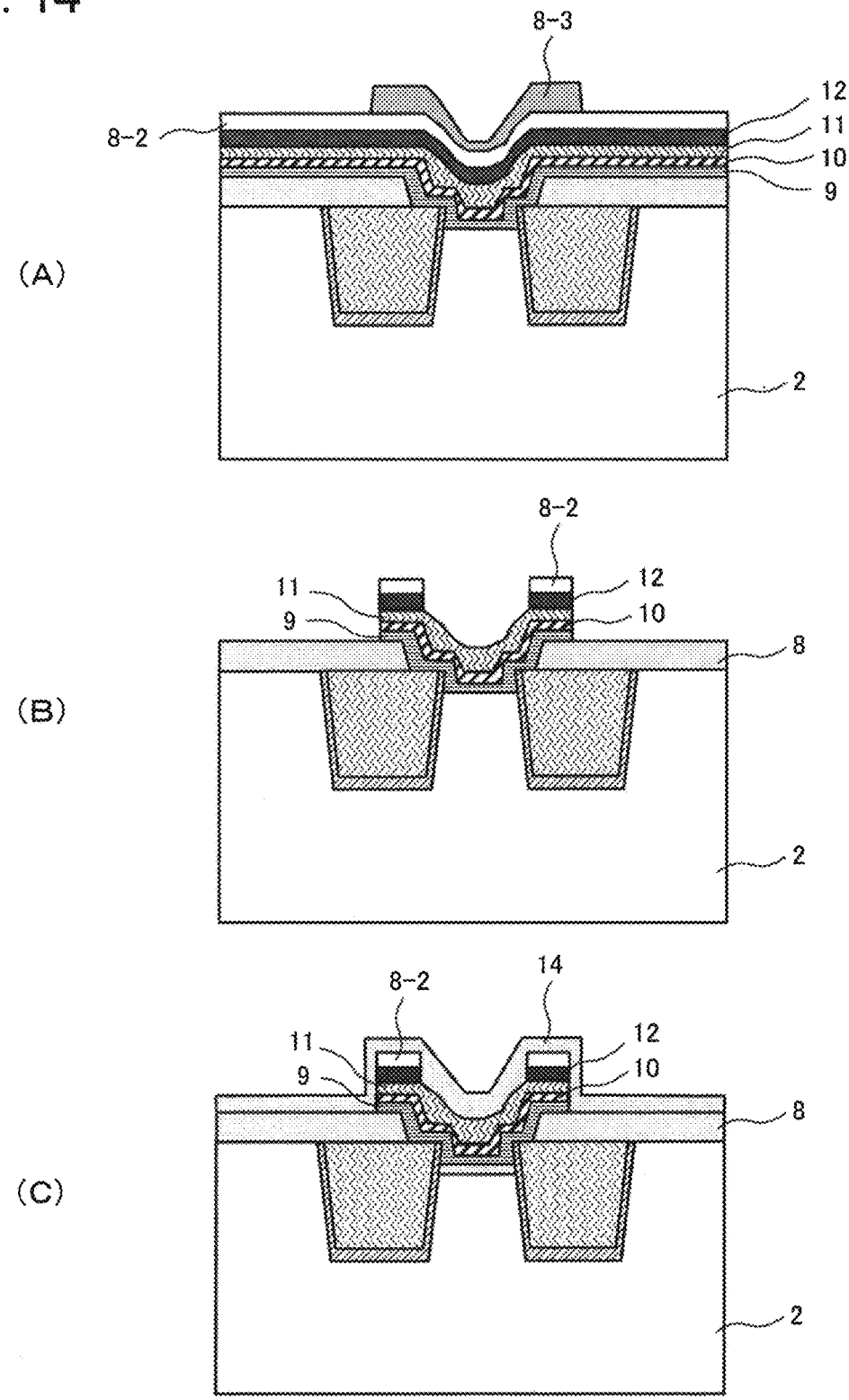
FIGS. 14(A) to 14(C) are cross-sectional views for illustrating steps of the manufacturing method, following FIGS. 13(A) to 13(C).

Consequently, patterning of the variable-resistance element part and the rectifying element part is performed in areas of the second hard mask film 8-2 and the third hard mask film 8-3 (referring to FIGS. 14(A) and 14(B)).

Next, the second hard mask film 8-2, the third electrode (control electrode) 12, the rectifying element 11, the second electrode 10, and the variable-resistance film 9 are continuously dry etched with the second hard mask film 8-2 and the third hard mask film 8-3 used as masks. At this time, it is preferable that the hard mask films be completely removed during the etch back but may remain intact.

For example, when the second electrode 10 is TiN, treatment may be performed by $Cl_2$-based reactive ion etching (RIE), and, when the second electrode 10 is Ru, RIE-treatment may be performed with a mixed gas of $Cl_2/O_2$. Further, in the etching of the variable-resistance film 9, dry etching needs to be stopped on the insulating barrier film 7 being a lower surface. Use of such a hard mask RIE method enables treatment without exposing the variable-resistance element part and the rectifying element part to oxygen plasma ashing for resist removal.

Next, the protective insulating film 14 (for example, an SiN film, 30 nm) is deposited on the third electrode (control electrode) 12, the rectifying element 11, the second electrode 10, and the insulating barrier film 7 comprising the variable-resistance film 9 (referring to FIG. 14(C)).

While the protective insulating film 14 may be formed by the plasma-enhanced CVD method, the film needs to be maintained at reduced pressure in a reaction chamber before film-forming, and, this poses an issue that oxygen is eliminated from a side surface of the variable-resistance film 9, and leak current of the solid electrolyte increases. In order to suppress such leak current, it is preferable that a film-forming temperature of the protective insulating film 14 be 350° C. or less. Additionally, since exposure to a film-forming gas occurs at reduced pressure before the formation of the protective insulating film 14 occurs, it is preferable not to use a reducing gas. For example, it is preferable to use an SiN film formed with high-density plasma of a mixed gas of $SiH_4/N_2$ at a substrate temperature of 200° C., or the like.

Figure 15:
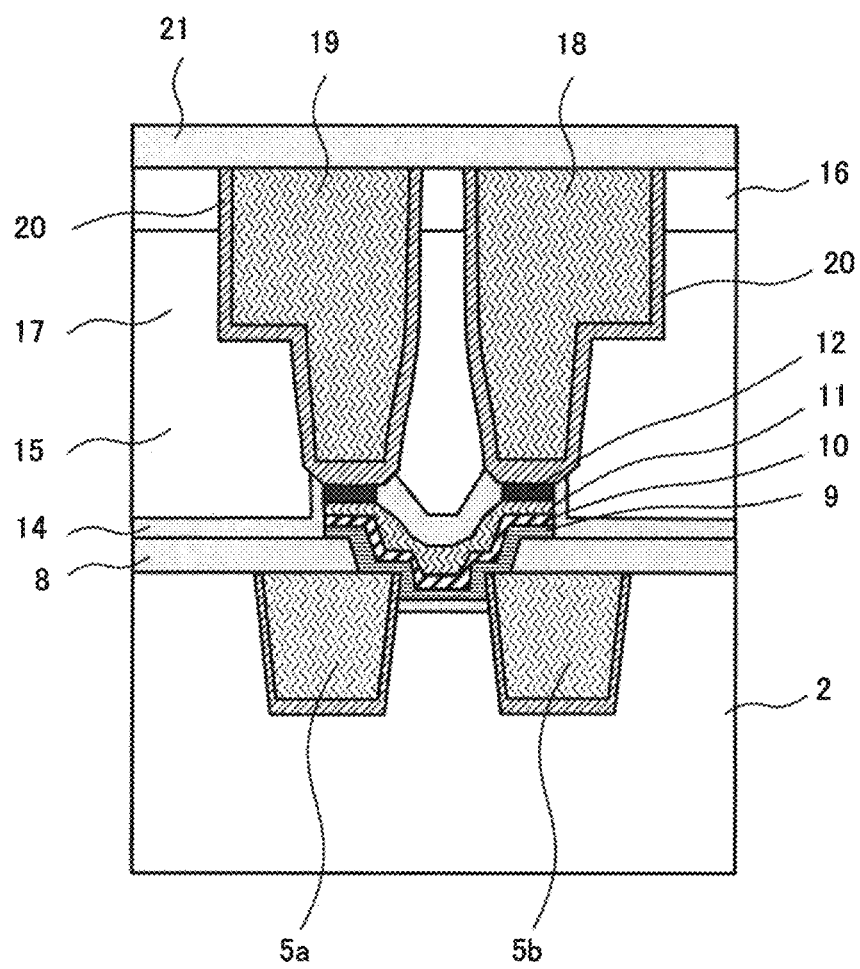
FIG. 15 is a diagram for illustrating a structure of a semiconductor device (switching element) obtained as a result of going through the steps of the manufacturing method illustrated in FIGS. 14(A) to 14(C), and is a cross-sectional view related to FIG. 8.

Next, as illustrated in FIG. 15, an interlayer insulating film 15 (for example, SiOC) is formed on the protective insulating film 14, and then the interlayer insulating film 15 is polished and planarized by CMP. Additionally, an interlayer insulating film 17 (for example, a silicon oxide film) and a hard mask film 16 are deposited in this order on the interlayer insulating film 15. Then, a wiring trench for a second wiring line 18, and a prepared hole for a plug 19 are formed, and the second wiring line 18 (for example, Cu) and the plug 19 (for example, Cu) are simultaneously formed in the wiring trench and the prepared hole, respectively, with a barrier metal 20 therebetween (for example, TaN/Ta) by using a copper dual-damascene wiring process, and then a barrier insulating film 21 (for example, an SiN film) is deposited on the hard mask film 16 comprising the second wiring line 18.

A process similar to the formation of the lower-layer wiring line (first wiring line 5) may be used for the formation of the second wiring line 18. At this time, by making the barrier metal 20 and the third electrode (third electrode) 12 be of a same material, contact resistance between the plug 19 and the control electrode (third electrode) 12 can be reduced, and element performance can be improved (resistance of the variable-resistance element 22 in an ON-state can be reduced).

The interlayer insulating film 15 and the interlayer insulating film 17 may be formed by the plasma-enhanced CVD method.

According to the present manufacturing method, by making the first wiring line 5 as a lower electrode of the variable-resistance element, that is, the first wiring line 5 also serving as a lower electrode of the variable-resistance element 22, increased density by downsizing of the variable-resistance element 22 and also improved reliability by forming a complementary-type variable-resistance element can be provided. The rectifying element 11 is formed on the top surface side of the variable-resistance element 22, and the variable-resistance element 22 can be mounted by only making three mask sets as an additional step to a common Cu damascene wiring process, which enables achievement of cost reduction of the device at the same time. Additionally, by equipping the variable-resistance element 22 inside a leading-edge device composed of a copper wiring line, performance of the device can be improved.

For example, while a technology of a semiconductor manufacturing device including a complementary metal oxide semiconductor (CMOS) circuit being a field of application as a background of the invention made by the present inventor has been described in detail, and an example of forming a variable-resistance element inside a copper multilayer wiring line on a semiconductor substrate has been described, the present invention is not limited thereto. For example, the present invention may be applied to a semiconductor product including memory circuits such as a dynamic random access memory (DRAM), a static random access memory (SRAM), a flash memory, a ferro-electric random access memory (FRAM) (registered trademark), a magnetic random access memory (MRAM), a variable-resistance type memory, and a bipolar transistor, a semiconductor product including logic circuits such as a microprocessor, or a copper wiring line on a board or a package concurrently carrying the semiconductor devices. Further, the present invention may be applied to a junction between a semiconductor device, and an electronic circuit device, an optical circuit device, a quantum circuit device, a micromachine, micro-electro-mechanical systems (MEMS), or the like. Further, while the examples related to a switching function according to the present invention have been mainly described, the present invention may be used in a memory element using non-volatility and a variable-resistance characteristic, and a rectifying element, and the like. Further, while characteristics of a metal ion precipitation type variable-resistance element have been mainly described as examples of the variable-resistance element according to the present invention, the operating principle of the variable-resistance element does not limit use of the present invention.

Further, the switching element according to the present invention can be determined from a final product. Specifically, when a variable-resistance element is mounted inside a multilayer wiring line, a lower surface of the variable-resistance element being a copper wiring line, the copper wiring line also serving as a lower electrode, and an opening existing between the two different lower-layer wiring lines can be determined by performing transmission electron microscope (TEM) observation on a cross section of the device, and thus whether the device includes a structure according to the present invention can be determined by the observation. Additionally, by performing a composition analysis such as an energy dispersive X-ray spectroscopy (EDX) method, and an electron energy-loss spectroscopy (EELS) method, in addition to TEM, whether a material is the material described in the present invention can be determined.

While it is apparent to a person skilled in the art after reading the description that many changes and substitutions can be easily made by equivalent components and technologies, it is apparent that such changes and substitutions fall under the scope and spirit of the attached claims.

The aforementioned example embodiments and examples may also be described in part or in whole as the following Supplementary Notes but are not limited thereto.

(Supplementary Note 1)

A switching element comprising at least a first variable-resistance element, a second variable-resistance element, and a rectifying element, wherein one end portion of the first variable-resistance element and one end portion of the second variable-resistance element are connected to one end portion of the rectifying element, and the rectifying element includes two terminals.

(Supplementary Note 2)

The switching element according to Supplementary Note 1, wherein operating polarities of the first variable-resistance element, the second variable-resistance element, and the rectifying element are same.

(Supplementary Note 3)

The switching element according to Supplementary Note 1 or 2, wherein a threshold voltage of the rectifying element is lower than a threshold voltage of the first variable-resistance element or the second variable-resistance element.

Supplementary Note 4)

The switching element according to any one of Supplementary Notes 1 to 3, wherein the rectifying element is a volatile-type variable-resistance element.

Supplementary Note 5)

The switching element according to any one of Supplementary Notes 1 to 4, wherein each of the first and second variable-resistance elements is a nonvolatile-type variable-resistance element including a first electrode, a second electrode, and a variable-resistance film sandwiched between the first electrode and the second electrode, the first electrode is an active electrode supplying a metal ion, the variable-resistance film is a layer through which a metal ion conducts, and the second electrode is an inactive electrode.

Supplementary Note 6)

The switching element according to any one of Supplementary Notes 1 to 5, wherein the switching element is inserted in a signal path, and input and output is performed through unconnected terminals of the first and second variable-resistance elements, and also resistance states of variable-resistance elements are controlled through an unconnected terminal of the rectifying element.

Supplementary Note 7)

The switching element according to Supplementary Note 5, wherein the switching element is formed in a multilayer wiring layer in a semiconductor device, the first electrode is a lower electrode-cum-copper wiring line, an insulating barrier film is formed on a top surface of a copper wiring line, an insulating barrier film includes an opening, the variable-resistance film is in contact with a lower electrode-cum-copper wiring line at an opening, and a second electrode, a rectifying element, and a third electrode are sequentially formed from bottom in this order on a top surface of the variable-resistance film.

Supplementary Note 8)

The switching element according to Supplementary Note 7, wherein the variable-resistance film is in contact with at least two or more of the lower electrode-cum-copper wiring lines at the opening, and the second electrode, the rectifying element, and the third electrode are integrated between two of the first and second variable-resistance elements.

Supplementary Note 9)

The switching element according to any one of Supplementary Notes 1 to 8, wherein the rectifying element is composed of any one of $SiN_x$, $TaO_x$, $NbO_x$, $HfO_x$, $TiO_x$, $ZrO_x$, and $WO_x$, or a multi-layered film thereof.

Supplementary Note 10)

The switching element according to Supplementary Note 7, wherein a principal component of the first electrode is Cu, a principal component of the second electrode is Ru, and the insulating barrier film is composed of any one of SiC, SiCN, and SiN.

Supplementary Note 11)

The switching element according to any one of Supplementary Notes 1 to 10, wherein programming of the first variable-resistance element is performed with the second rectifying element therebetween, and programming of the second variable-resistance element is performed with the first rectifying element therebetween.

Supplementary Note 12)

A semiconductor device including a bipolar-type variable-resistance element in a copper multilayer wiring layer on a semiconductor substrate, the semiconductor device including:

a plurality of first electrode-cum-copper wiring lines formed in the copper multilayer wiring layer;

an insulating barrier film formed on the plurality of first electrode-cum-copper wiring lines;

an opening formed on the insulating barrier film, the opening connecting to the first electrode-cum-copper wiring line, and a wall surface of the opening being a tapered surface a width of which becomes wider as a distance from the copper wiring line becomes longer;

a variable-resistance film formed on a plane including the opening;

a second electrode formed on the variable-resistance film;

a rectifying element formed on the second electrode; and a third electrode formed on the rectifying element.

Supplementary Note 13)

The semiconductor device according to Supplementary Note 12, wherein the third electrode is a control electrode.

Supplementary Note 14)

The semiconductor device according to Supplementary Note 12 or 13, wherein the variable-resistance film, the second electrode, the rectifying element, and the third electrode constitute a multi-layered structure.

Supplementary Note 15)

The semiconductor device according to Supplementary Note 14, wherein a combination of the rectifying element and the third electrode is arranged in a wiring layer above the copper wiring line also serving as a first electrode.

Supplementary Note 16)

The semiconductor device according to Supplementary Note 14, further including two openings formed on the insulating barrier film, the openings connecting to the copper wiring line also serving as a first electrode, wherein a combination of the variable-resistance film and the second electrode is formed on each of the openings, and a combination of the rectifying element and the third electrode is arranged in a part related to the two openings, in a separate wiring layer above the copper wiring line also serving as a first electrode.

Supplementary Note 17)

A manufacturing method of a semiconductor device including a bipolar-type variable-resistance element in a copper multilayer wiring layer on a semiconductor substrate, the semiconductor device manufacturing method comprising:

a step of forming an insulating barrier film on a first electrode-cum-copper wiring line;

a step of forming an opening on the insulating barrier film, the opening connecting to the first electrode-cum-copper wiring line and a wall surface of the opening being a tapered surface a width of which becomes wider as a distance from the copper wiring line becomes longer;

a step of forming a variable-resistance film on a surface comprising the opening;

a step of forming a second electrode on the variable-resistance film;

a step of forming a rectifying element on the second electrode; and a step of forming a third electrode on the rectifying element.

Supplementary Note 18)

The semiconductor device manufacturing method according to Supplementary Note 17, wherein the variable-resistance film, the second electrode, the rectifying element, and the third electrode are formed by etching with a common mask.

Supplementary Note 19)

The semiconductor device manufacturing method according to Supplementary Note 17 or 18, wherein formation of the variable-resistance film, the second electrode, the rectifying element, and the third electrode is performed through:

a step of forming a variable-resistance film, a second electrode, a rectifying element, a third electrode, and a hard mask film in this order on an entire surface comprising the opening;

a step of, by performing patterning treatment on the hard mask film, forming a mask region related to a region comprising a variable-resistance element part and a rectifying element part; and a step of, by continuously etching a third electrode, a rectifying element, a second electrode, and a variable-resistance film with the mask region used as a mask, forming a multi-layered structure of the variable-resistance film, the second electrode, the rectifying element, and the third electrode.

Supplementary Note 20)

A crossbar switch array using the switching element according to any one of Supplementary Notes 1 to 11, wherein a horizontal line is made to serve as a first lower-layer wiring line, a vertical line is made to serve as a second lower-layer wiring line, and a diagonal line connected to a control terminal is made to serve as an upper-layer wiring line.

Supplementary Note 21)

The crossbar switch array according to Supplementary Note 20, further including:

a first wiring line connected to another end of the first variable-resistance element and a second wiring line connected to another end of the second variable-resistance element, wherein the first wiring line and the second wiring line extend in directions orthogonal to one another.

Supplementary Note 22)

The crossbar switch array according to Supplementary Note 20 or 21, further including:

a third wiring line connected to another end of the first rectifying element and a fourth wiring line connected to another end of the second rectifying element, wherein, the third wiring line and the fourth wiring line extend in directions orthogonal to one another.

Supplementary Note 23)

The crossbar switch array according to any one of Supplementary Notes 20 to 22, wherein the first wiring line and the third wiring line extend in parallel with one another, and the second wiring line and the fourth wiring line extend in parallel with one another.

Supplementary Note 24)

A crossbar switch array arranging at least two or more of the switching elements according to any one of Supplementary Notes 1 to 11, in an array, and sharing at least one wiring line connected to an unconnected terminal by a plurality of the switching elements, the crossbar switch array further including:

a first wiring line connected to another end of the first variable-resistance element, a second wiring line connected to another end of the second variable-resistance element, a third wiring line connected to another end of the first rectifying element, and a fourth wiring line connected to another end of the second rectifying element, wherein the first and third wiring lines are in parallel with one another, and the second and fourth wiring lines are orthogonal to the first and third wiring lines.

The present invention has been described with the aforementioned example embodiments as exemplary examples. However, the present invention is not limited to the aforementioned example embodiments. In other words, various modes that may be understood by a person skilled in the art may be applied to the present invention, within the scope thereof.

This application is based upon and claims the benefit of priority from Japanese Patent Application No. 2015-077495, filed on Apr. 6, 2015, the disclosure of which is incorporated herein in its entirety by reference.

REFERENCE SIGNS LIST

2 Interlayer insulating film
5a, 5b First wiring line
6a, 6b Barrier metal
7 Insulating barrier film
8 Hard mask film
9 Variable-resistance film
10 Second electrode
11 Rectifying element
12 Control electrode (third electrode)
14 Protective insulating film
15 Interlayer insulating film
16 Hard mask film
17 Interlayer insulating film
18 Second wiring line
19 Plug
20 Barrier metal
21 Barrier insulating film
101 First variable-resistance element
101a First electrode
101b First variable-resistance film
101c Second electrode
102 Second variable-resistance element
102a First electrode
102b Second variable-resistance film
102c Second electrode
103 Rectifying element
103a First electrode
103b Rectifying film
103c Second electrode
111 First terminal
112 Second terminal
113 Third terminal
401a First active electrode
401b Second active electrode
402 Solid electrolyte
403 Inactive electrode
404 Rectifying element
405 Control electrode (third electrode)
406a, 406b Metal bridge

What is claimed is:

1. A switching element comprising: a first variable-resistance element, a second variable-resistance element, a first rectifying element, and a second rectifying element, wherein
   each of the first rectifying element and the second rectifying element is a two-terminal element, and
   one end portion of the first variable-resistance element and one end portion of the second variable-resistance element are connected to one end portion of the first rectifying element and one end portion of the second rectifying element.

2. The switching element according to claim 1, wherein the switching element is to be inserted in a signal path, and
   input and output are performed through unconnected terminals of the first variable-resistance element and the second variable-resistance element, and resistance states of the first variable-resistance element and the second variable-resistance element are controlled through unconnected terminals of the first rectifying element and the second rectifying element.

3. The switching element according to claim 1, wherein programming of the first variable-resistance element is performed through the second rectifying element, and programming of the second variable-resistance element is performed through the first rectifying element.

4. The switching element according to claim 1, wherein each of the first variable-resistance element and the second variable-resistance element is a nonvolatile-type variable-resistance element including a first electrode, a second electrode, and a variable-resistance film sandwiched between the first electrode and the second electrode,
   the first electrode is an active electrode supplying a metal ion,
   the variable-resistance film is a layer through which a metal ion conducts, and
   the second electrode is an inactive electrode.

5. The switching element according to claim 1, wherein the first and second rectifying elements are elements each of which including a third electrode, a fourth electrode, and a rectifying film sandwiched between the third electrode and the fourth electrode, and
   the third electrode is of a same material as the fourth electrode.

6. A crossbar switch array wherein at least two or more of the switching elements according to claim 1 are arranged in an array, and a plurality of the switching elements share at least one wiring connected to an unconnected terminal.

7. A semiconductor device comprising a bipolar-type variable-resistance element in a copper multilayer wiring layer on a semiconductor substrate, the bipolar-type variable-resistance element comprising a first variable-resistance element, a second variable-resistance element, a first rectifying element and a second rectifying element, and the semiconductor device comprising:
   a plurality of copper wiring lines formed in the copper multilayer wiring layer, the plurality of copper wiring lines further serving as first electrodes;
   an insulating barrier film formed on the plurality of copper wiring lines serving as first electrodes;
   an opening formed on the insulating barrier film, the opening connecting to the copper wiring line serving as a first electrode;
   a variable-resistance film formed on a plane including the opening;
   a second electrode formed on the variable-resistance film; and
   the first rectifying element and the second rectifying element formed on the second electrode.

8. The semiconductor device according to claim 7, further comprising:
   a third electrode as a control electrode, the third electrode being formed on the first rectifying element and the second rectifying element.

9. A manufacturing method of a semiconductor device including a bipolar-type variable-resistance element in a copper multilayer wiring layer on a semiconductor substrate, the bipolar-type variable-resistance element comprising a first variable-resistance element, a second variable-resistance element, a first rectifying element and a second rectifying element, and the semiconductor device manufacturing method comprising:
   forming an insulating barrier film on a copper wiring, the copper wiring lines further serving as a first electrode;
   forming an opening on the insulating barrier film, the opening exposing the copper wiring serving as a first electrode;
   forming a variable-resistance film on a surface including the opening;
   forming a second electrode on the variable-resistance film;
   forming the first and a second rectifying elements above the second electrode, respectively; and
   forming a third electrode on the first and the second rectifying elements, respectively.

10. The semiconductor device manufacturing method according to claim 9, wherein
   formation of the variable-resistance film, the second electrode, the first and the second rectifying elements, and the third electrode is performed through:
   forming a variable-resistance film, a second electrode, a rectifying element, a third electrode, and a hard mask film in this order on an entire surface including the opening;
   by performing patterning treatment on the hard mask film, forming a mask region related to a region including a variable-resistance element part and a rectifying element part; and,
   by continuously etching the third electrode, the first and the second rectifying elements, the second electrode, and the variable-resistance film using the mask region as a mask, forming a multi-layered structure of the variable-resistance film, the second electrode, the first and the second rectifying elements, and the third electrode.

* * * * *